(12) United States Patent
Sieber

(10) Patent No.: US 10,320,245 B2
(45) Date of Patent: Jun. 11, 2019

(54) LATERAL POSITIONING FOR WIRELESS ELECTRIC VEHICLE CHARGING

(71) Applicant: Wi Tricity Corporation, Watertown, MA (US)

(72) Inventor: Lukas Sieber, Olten (CH)

(73) Assignee: WiTricity Corporation, Watertown, MA (US)

( * ) Notice: Subject to any disclaimer, the term of this patent is extended or adjusted under 35 U.S.C. 154(b) by 226 days.

(21) Appl. No.: 15/630,184

(22) Filed: Jun. 22, 2017

(65) Prior Publication Data

US 2018/0375390 A1 Dec. 27, 2018

(51) Int. Cl.
| | |
|---|---|
| *H02J 7/00* | (2006.01) |
| *H02J 50/90* | (2016.01) |
| *G01B 15/00* | (2006.01) |
| *G01R 29/08* | (2006.01) |
| *B60L 53/12* | (2019.01) |

(52) U.S. Cl.
CPC .............. *H02J 50/90* (2016.02); *B60L 53/12* (2019.02); *G01B 15/00* (2013.01); *G01R 29/0878* (2013.01); *B60L 2240/62* (2013.01)

(58) Field of Classification Search
CPC . H02J 50/90; H02J 50/10; H02J 7/025; B60L 53/12; G01R 29/0878
USPC .......................................................... 320/108
See application file for complete search history.

(56) References Cited

U.S. PATENT DOCUMENTS

| | | | |
|---|---|---|---|
| 4,088,999 A | 5/1978 | Fletcher et al. | |
| 5,696,367 A | 12/1997 | Keith | |
| 5,969,624 A * | 10/1999 | Sakai | B60K 6/46 340/636.1 |
| 6,624,529 B2 * | 9/2003 | Obayashi | H02J 1/14 290/40 B |
| 2002/0113441 A1 * | 8/2002 | Obayashi | H02J 1/14 290/40 C |
| 2010/0194529 A1 * | 8/2010 | Yamamoto | G07F 15/003 340/5.65 |
| 2012/0262002 A1 * | 10/2012 | Widmer | B60L 53/65 307/104 |
| 2013/0037339 A1 | 2/2013 | Hickox | |
| 2014/0012448 A1 * | 1/2014 | Tripathi | G05D 1/0276 701/22 |
| 2014/0111019 A1 * | 4/2014 | Roy | G01V 3/081 307/104 |

FOREIGN PATENT DOCUMENTS

| | | |
|---|---|---|
| WO | 2006127185 A2 | 11/2006 |
| WO | 2014182471 A2 | 11/2014 |

* cited by examiner

*Primary Examiner* — Yalkew Fantu
(74) *Attorney, Agent, or Firm* — Hunter Clark PLLC

(57) ABSTRACT

A method of determining alignment of an inductive power coupler of an electric vehicle relative to an inductive power transmit element includes: receiving, at the electric vehicle, a first wireless signal and a second wireless signal; analyzing the first wireless signal and the second wireless signal to determine an alignment value, the alignment value being a magnitude of the first wireless signal relative to a magnitude of the second wireless signal or being a difference between a time of arrival of the first wireless signal and a time of arrival of the second wireless signal; and determining, based on the alignment value, an indication of a lateral offset of the inductive power coupler of the electric vehicle relative to the inductive power transmit element.

30 Claims, 8 Drawing Sheets

LATERAL POSITIONING FOR WIRELESS ELECTRIC VEHICLE CHARGING

TECHNICAL FIELD

The disclosure relates generally to wireless power delivery to electronic devices, and in particular to alignment of a power receiver and a power transmitter of a wireless electric vehicle charging system.

BACKGROUND

Remote systems, such as vehicles, have been introduced that include locomotion power derived from electricity received from an energy storage device such as a battery. Such energy storage devices need to be periodically charged. For example, hybrid electric vehicles include on-board chargers that use power from vehicle braking and traditional motors to charge the vehicles. Battery electric vehicles (electric vehicles) are often proposed to be charged through some type of wired alternating current (AC) such as household or commercial AC supply sources. The wired charging connections require cables or other similar connectors that are physically connected to a power supply. Cables and similar connectors may sometimes be inconvenient or cumbersome and have other drawbacks. Wireless charging systems that are capable of transferring power in free space (e.g., via an electromagnetic field) to be used to charge electric vehicles may overcome some of the deficiencies of wired charging solutions.

SUMMARY

The following detailed description and accompanying drawings provide a better understanding of the nature and advantages of the disclosure.

An example of wireless electric vehicle charging system includes: an electric load; an inductive power coupler communicatively coupled to the electric load and configured to couple wirelessly and inductively to a magnetic field to receive sufficient energy from an inductive power transmit element to at least one of charge the electric load or to operate the electric load; a receiver; and a processor communicatively coupled to the receiver and to the electric load and configured to: determine an alignment value associated with a first signal received by the receiver and a second signal received by the receiver, wherein the alignment value is a magnitude of the first signal relative to a magnitude of the second signal or is a difference between a time of arrival of the first signal and a time of arrival of the second signal; and determine, based on the alignment value, an indication of a lateral offset of the inductive power coupler relative to the inductive power transmit element.

An example of a method of determining alignment of an inductive power coupler of an electric vehicle relative to an inductive power transmit element includes: receiving, at the electric vehicle, a first wireless signal and a second wireless signal; analyzing the first wireless signal and the second wireless signal to determine an alignment value, the alignment value being a magnitude of the first wireless signal relative to a magnitude of the second wireless signal or being a difference between a time of arrival of the first wireless signal and a time of arrival of the second wireless signal; and determining, based on the alignment value, an indication of a lateral offset of the inductive power coupler of the electric vehicle relative to the inductive power transmit element.

Another example of a wireless electric vehicle charging system includes: an electric load; coupling means, communicatively coupled to the electric load, for receiving energy wirelessly from a power transmit element to at least one of charge the electric load or to operate the electric load; receiving means for receiving a first alignment signal and a second alignment signal; and first determining means for determining an alignment value associated with a first signal received by the receiving means and a second signal received by the receiving means, wherein the alignment value is a magnitude of the first signal relative to a magnitude of the second signal or is a difference between a time of arrival of the first signal and a time of arrival of the second signal; and second determining means for determining, based on the alignment value, an indication of a lateral offset of the coupling means relative to the power transmit element.

An example of a non-transitory, processor-readable storage medium includes instructions configured to cause a processor to: analyze a first wireless signal and a second wireless signal to determine an alignment value, the alignment value being a magnitude of the first wireless signal relative to a magnitude of the second wireless signal or being a difference between a time of arrival of the first wireless signal and a time of arrival of the second wireless signal; and determine, based on the alignment value, an indication of a lateral offset of an inductive power coupler of a vehicle relative to an inductive power transmit element of a wireless charger.

Figure 1:
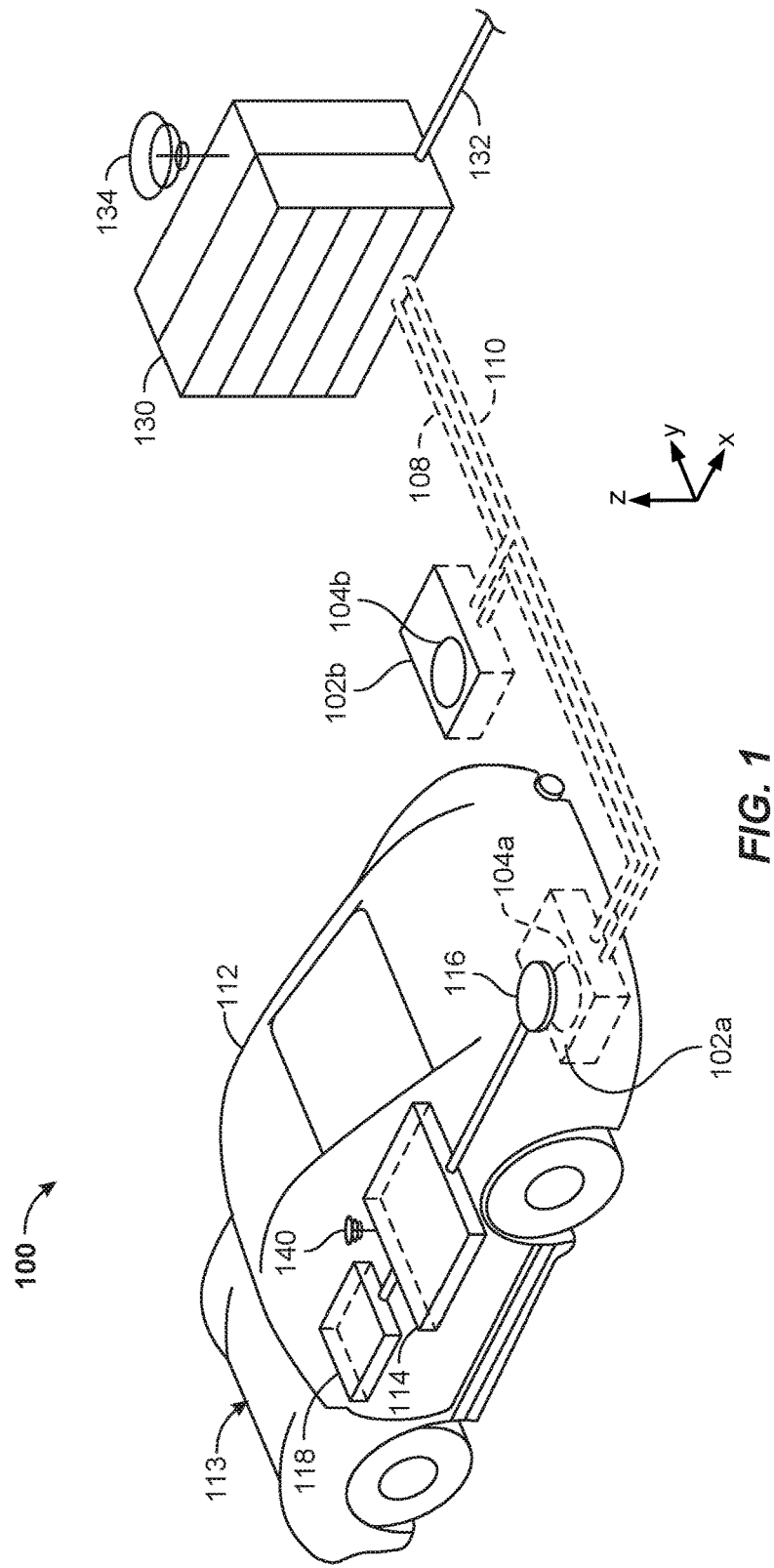
FIG. 1 is a perspective view of an example wireless electric vehicle charging system.

The various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The detailed description set forth below in connection with the appended drawings is a description of example implementations and does not represent the only implementations in which the invention may be practiced. The term "exemplary" used throughout this description means "serving as an example, instance, or illustration," and does not require that the item(s) described as exemplary is(are) preferred or advantageous over other implementations. The detailed description includes specific details for the purpose of providing a thorough understanding of the implementations. In some instances, some devices are shown in block diagram form.

Wirelessly transferring power may refer to transferring any form of energy associated with electric fields, magnetic fields, electromagnetic fields, or otherwise from a transmitter to a receiver without the use of physical electrical conductors (e.g., power may be transferred through free space). The power output into an electro-magnetic field (e.g., a magnetic field) may be received, captured by, or coupled by a "receiving element" to achieve power transfer.

Techniques are discussed herein for determining various characteristics of components of wireless electric vehicle charging (WEVC) systems. For example, techniques are discussed for determining a leakage inductance of a primary side power-coupling element, leakage inductance of a secondary side power-coupling element, and a mutual inductance of the primary side and secondary side of a WEVC system may be determined. The primary side is configured to provide charging power to the secondary side. With the primary side and secondary side in a fixed physical relationship to each other, a resonant frequency of the one of the sides, e.g., the secondary side, is determined. With the physical relationship the same, a component content of at least one of the sides, e.g., in circuitry that receives energy coupled from the other side, is changed and the resonant frequency is re-determined. Further, currents in the power-coupling elements are determined. The two resonant frequencies and the currents are used to determine the leakage inductance of each of the power-coupling elements and the mutual inductance. Other examples are within the scope of the disclosure, some of which are discussed below.

Items and/or techniques described herein may provide one or more of the following capabilities, as well as other capabilities not mentioned. Characteristics of a wireless power receiving system can be determined. Which of multiple frequencies to use to charge the wireless power receiving system more efficiently may be determined. Provision of high amounts of power by a vehicle charging pad without a vehicle being sufficiently aligned with the vehicle charging pad may be guarded against. Provision of high amounts of power from a vehicle charging pad to a living object may be guarded against. Wireless electric vehicle charging systems may be protected from negative effects of foreign objects, e.g., from conductive objects heating up in the presence of a magnetic field provided by a wireless electric vehicle charging system. Other capabilities may be provided and not every implementation according to the disclosure must provide any, let alone all, of the capabilities discussed.

An electric vehicle is used herein to describe a remote system, an example of which is a vehicle that includes, as part of its locomotion capabilities, electrical power derived from a chargeable energy storage device (e.g., one or more rechargeable electrochemical cells or other type of battery). As non-limiting examples, some electric vehicles may be hybrid electric vehicles that include, besides electric motors, a traditional combustion engine for direct locomotion or to charge the vehicle's battery. Other electric vehicles may draw all locomotion ability from electrical power. An electric vehicle is not limited to an automobile and may include motorcycles, carts, scooters, and the like. By way of example and not limitation, a remote system is described herein in the form of an electric vehicle (EV). Furthermore, other remote systems that may be at least partially powered using a chargeable energy storage device are also contemplated (e.g., electronic devices such as personal computing devices and the like) and possible, whether presently known or not.

FIG. 1 is a diagram of a wireless charging system 100 for charging an electric vehicle 112, in accordance with some implementations. The wireless charging system 100 enables charging of an electric vehicle 112 while the electric vehicle 112 is parked near a base wireless charging system 102a. Spaces for two electric vehicles are illustrated in a parking area to be parked over corresponding base wireless charging systems 102a and 102b. In some implementations, a local power distribution center 130 may be connected to a power backbone 132 and configured to provide an alternating current (AC) or a direct current (DC) supply through a power link 110 to the base wireless charging systems 102a and 102b. The base wireless charging system 102a includes a base power transfer element 104a for wirelessly transferring (e.g., transmitting and/or receiving) power. Likewise, the base wireless charging system 102b includes a base power transfer element 104b for wirelessly transferring power. In some implementations (not shown in FIG. 1), the base power transfer elements 104a or 104b may be stand-alone physical units that are not part of the base wireless charging systems 102a or 102b. The electric vehicle 112 may include a battery unit 118, and an electric vehicle wireless charging system 114 including an electric vehicle power transfer element 116. In some implementations (not shown in FIG. 1), the vehicle power transfer element 116 may be part of the electric vehicle wireless charging system 114. In some implementations, the entity comprising the base power transfer element 104a is referred to as the base pad and the entity comprising the vehicle power transfer element 116 is referred to as the vehicle pad.

The electric vehicle power transfer element 116 may interact with the base power transfer element 104a for example, via a region of a wireless field generated by the base power transfer element 104a. In some implementations, the electric vehicle power transfer element 116 may receive power when the electric vehicle power transfer element 116 is located in an energy field produced by the base power transfer element 104a. The field corresponds to a region where energy output by the base power transfer element 104a may be captured by the electric vehicle power transfer element 116. For example, the energy output by the base power transfer element 104a may be at a level sufficient to charge or power the electric vehicle 112.

In some implementations, the field may correspond to the "near field" of the base power transfer element 104a. The near field may correspond to a region in which there are strong reactive fields resulting from the currents and charges in the base power transfer element 104a that do not radiate power away from the base power transfer element 104a. In some implementations, the near field may correspond to a region that is within about $\frac{1}{2}\pi$ of a wavelength of the base power transfer element 104a (and vice versa for the electric vehicle power transfer element 116).

The local power distribution center 130 may be configured to communicate with external entities (e.g., a power grid management system) via a communication backhaul 134, and with the base wireless charging system 102a via a communication link 108 (e.g., wired or wireless). For example, the communication backhaul 134 may communicate with an antenna 140 of the vehicle 112 regarding the charging infrastructure of the system 100.

In some implementations, the electric vehicle power transfer element 116 may be aligned with the base power transfer element 104a and, therefore, disposed within a near-field region simply by the driver positioning the electric vehicle 112 correctly relative to the base power transfer element 104a. In other implementations, the driver may be given visual, auditory, or tactile feedback, or combinations thereof, to determine when the electric vehicle 112 is properly placed for wireless power transfer. In yet other implementations, the electric vehicle 112 may be positioned by an autopilot system, which may move the electric vehicle 112 back and forth (e.g., in zig-zag movements) until an alignment error has reached a tolerable value. This may be performed automatically and autonomously by the electric vehicle 112 without or with only minor driver intervention provided that the electric vehicle 112 is equipped with appropriate equipment such as a servo steering wheel, ultrasonic sensors, and intelligence to adjust the electric vehicle 112. In still other implementations, the electric vehicle power transfer element 116, the base power transfer element 104a, or a combination thereof, may have functionality for displacing and moving the power transfer elements 116 and 104a relative to each other to more accurately position them and develop more efficient coupling there between.

The base wireless charging system 102a may be located in a variety of locations. As non-limiting examples, some suitable locations include a parking area at a home of an owner of the electric vehicle 112, parking areas reserved for electric vehicle wireless charging modeled after conventional petroleum-based filling stations, and parking lots at other locations such as shopping centers and places of employment.

Charging electric vehicles wirelessly may provide numerous benefits. For example, charging may be performed automatically, virtually without driver intervention and manipulations thereby improving convenience to a user. There may be no exposed electrical contacts and no or little mechanical wear out, thereby improving reliability of the wireless charging system 100. Manipulations with cables and connectors may not be needed, and there may be no cables, plugs, or sockets that may be exposed to moisture and water in an outdoor environment, thereby improving safety. There may be no sockets, cables, and plugs visible or accessible, thereby reducing potential vandalism of power charging devices. Further, since the electric vehicle 112 may be used as a distributed storage device to stabilize a power grid, a convenient docking-to-grid solution may help to increase availability of vehicles for Vehicle-to-Grid (V2G) operation. The wireless charging system 100 as described with reference to FIG. 1 may provide aesthetic and non-impedimental advantages. For example, there may be no charge columns and cables that may be impedimental for vehicles and/or pedestrians.

As a further explanation of the vehicle-to-grid capability, the wireless power transmit and receive capabilities may be configured to be reciprocal such that the base wireless charging system 102a transfers power from the power distribution grid to the electric vehicle 112 via the electric vehicle charging system 114 and the electric vehicle charging system 114 transfers power from the electric vehicle 112 via the base wireless charging system 102a to the grid, e.g., in times of energy shortfall. This capability may be useful to stabilize the power distribution grid by allowing electric vehicles to contribute power to the overall distribution system in times of energy shortfall caused by over demand or shortfall in renewable energy production (e.g., wind or solar).

Figure 2:
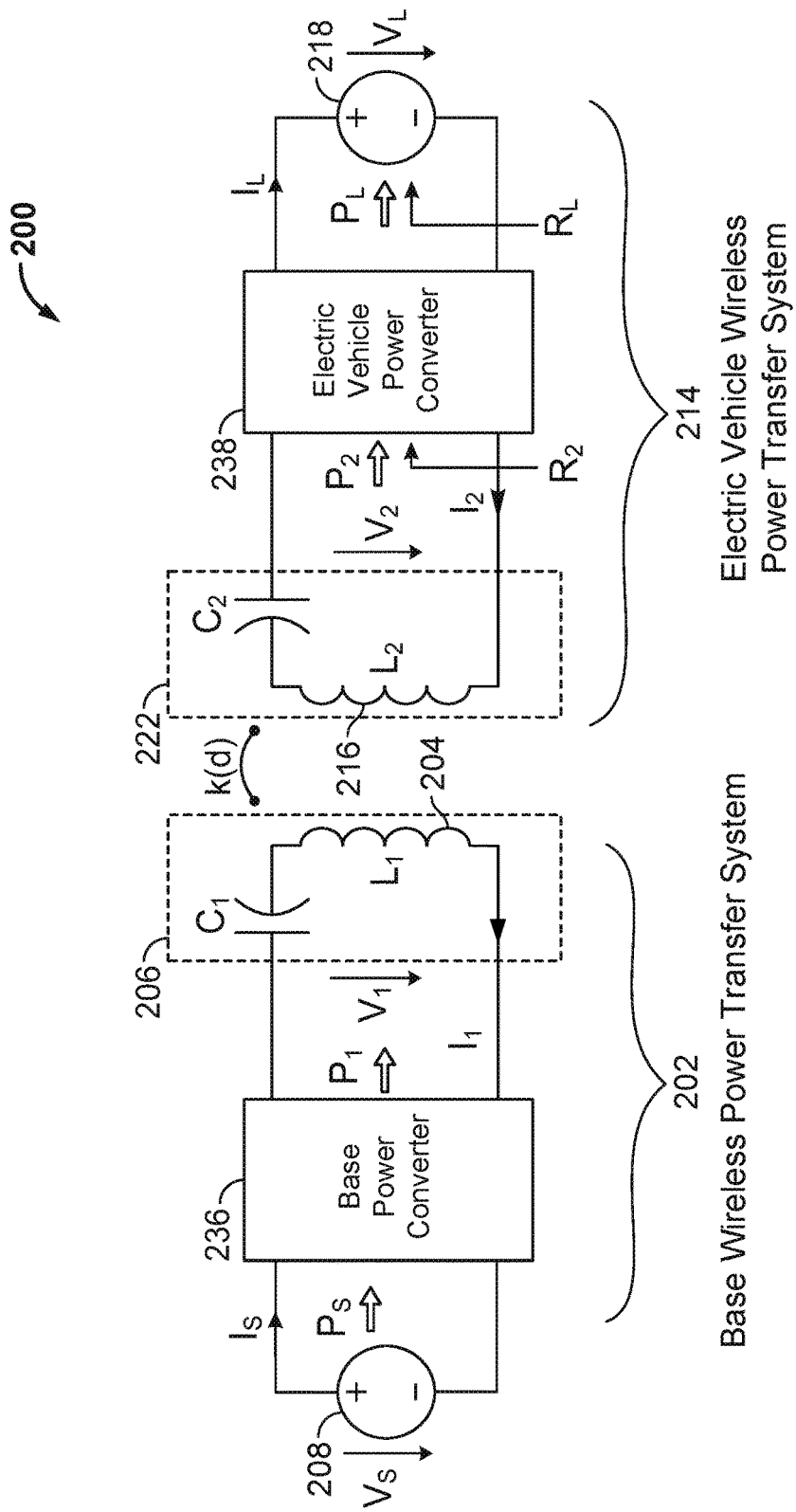
FIG. 2 is a schematic diagram of example components of a primary side and a secondary side of the wireless electric vehicle charging system shown in FIG. 1.

FIG. 2 is a schematic diagram of exemplary components of a wireless power transfer system 200 that may be used for inductive power transfer. As shown in FIG. 2, the wireless power transfer system 200 may be comprised of a base wireless power transfer system 202 and an electric vehicle wireless power transfer system 214. The base wireless power transfer system 202 may include a base transmit circuit 206 including a base power transfer element 204 having an inductance $L_1$. Analogously, as shown in FIG. 2, the electric vehicle wireless power transfer system 214 may include an electric vehicle receive circuit 222 including an electric vehicle power transfer element 216 having an inductance $L_2$.

Implementations of the base transmit circuit 206 and the electric vehicle receive circuit 222 described herein may use capacitively-loaded wire loops (i.e., multi-turn coils) forming a resonant circuit that is capable of efficiently coupling energy from a primary element (transmitter) to a secondary element (receiver) via a magnetic or electromagnetic near field if both primary and secondary elements are tuned to substantially a common resonant frequency (substantially the same resonant frequency). Using resonant circuits or structures for coupling energy may be referred to "magnetic coupled resonance," "electromagnetic coupled resonance," and/or "resonant induction." The operation of the wireless power transfer system 200 will be described based on power transfer from the power distribution grid via the base wireless power transfer system 202 and the electric vehicle wireless power transfer system 214 to an electric vehicle 112, but is not limited thereto. For example, as discussed above, the electric vehicle 112 may transfer power in the reverse direction via the electric vehicle wireless power transfer system 214 and the base wireless power transfer system 202 to the power distribution grid.

With reference to FIG. 2, a power supply 208 (e.g., AC or DC) supplies power $P_S$ to the base wireless power transfer system 202 to transfer energy to the electric vehicle 112 via the electric vehicle power transfer system 214. The base wireless power transfer system 202 includes a base power converter 236. The base power converter 236 may include circuitry such as an AC/DC converter configured to convert power from standard mains AC to DC power at a suitable voltage level, and a DC/AC converter configured to convert DC power to power at an operating frequency suitable for wireless high-power transfer. The power converter 236 supplies power $P_1$ to the base transmit circuit 206 including the base power transfer element 204 to emit a field at a desired frequency. The base transmit circuit 206 may include a capacitor $C_1$ coupled in series to a coil of the base power transfer element 204 as shown in FIG. 2 by example. Alternatively, the base transmit circuit 206 may be formed with the capacitor $C_1$ coupled in parallel to the coil, or may be formed of several reactive elements in any combination of parallel or series topology. The capacitor $C_1$ or the reactive elements may be provided to form a resonant circuit with the base power transfer element 204 near or at the operating frequency defined by the base wireless power transfer system 202. The base power transfer element 204 receives the power $P_1$ and wirelessly transmits power at a level sufficient to charge or power the electric vehicle 112. For example, the power level provided wirelessly by the base power transfer element 204 may be on the order of kilowatts (kW) (e.g., anywhere from 1 kW or lower to 110 kW or higher).

The electric vehicle power transfer element 216 may be positioned within the near field of a primary electromagnetic field transmitted by the base power transfer element 204. In this case, the base power transfer element 204 and the electric vehicle power transfer element 116 may become coupled to one another such that power may be transferred to the electric vehicle receive circuit 222. Element k(d) represents the coupling coefficient resulting at coil separation d. The electric vehicle receive circuit 222 may include a capacitor $C_2$ coupled in series with a coil of the electric vehicle power transfer element 216 as shown in FIG. 2 by example. Alternatively, the electric vehicle receive circuit 222 may be formed with the capacitor $C_2$ coupled in parallel with the coil, or may be formed of several reactive elements in any combination of parallel or series topology. The capacitor $C_2$ or the reactive elements may be provided to form a resonant circuit with the electric vehicle power transfer element 216 near or at the operating frequency as defined by the electric vehicle wireless power transfer system 214. Due to the resonance of the electric vehicle receive circuit 222, the electric vehicle power transfer element 116 may generate a secondary electromagnetic field. The electric vehicle receive circuit 222 receives power $P_2$ and provides the power $P_2$ to an electric vehicle power converter 238 of the electric vehicle wireless power transfer system 214.

As just described, the resonant frequency may be based on the inductance and capacitance. As shown in FIG. 2, inductance may generally be the inductance of the power transfer element (e.g., a coil), whereas, capacitance may be added to the power transfer element to create a resonant structure at a desired resonant frequency.

The electric vehicle power converter 238 may include, among other things, an AC/DC converter configured to convert power at an operating frequency back to DC power at a voltage level matched to the voltage level of an electric vehicle load 218 (e.g. a battery or battery pack). The electric vehicle power converter 238 may provide a converted power $P_L$ to charge the electric vehicle load 218.

The power supply 208, the base power converter 236, and the base power transfer element 204 may be stationary and located at a variety of locations as discussed above. The electric vehicle power converter 238, and the electric vehicle power transfer element 216 may be onboard the electric vehicle 112. In some implementations, both the electric vehicle power converter 238 and the electric vehicle power transfer element 216 are integrated in the electric vehicle load 118 (e.g., in a battery pack). The electric vehicle wireless power transfer system 214 may be configured to provide power wirelessly through the electric vehicle power transfer element 216 and the base power transfer element 204 to the base wireless power transfer system 202 to feed power back to the grid. In some implementations, each of the electric vehicle power transfer element 216 and the base power transfer element 204 may act as a transmit or a receive element based on the mode of operation.

While not shown in FIG. 2, the wireless power transfer system 200 may include a vehicle-side load disconnect unit (LDU) to safely disconnect the electric vehicle load 218 from the wireless power transfer system 200. In some implementations supporting reverse mode operation, an LDU may be provided on the base side (not shown) to safely disconnect the power supply 208 (acting as a load) from the wireless power transfer system 200. For example, in case of an emergency or system failure, the LDU may be triggered to disconnect the load from the wireless power transfer system 200. The LDU may be provided in addition to a battery management system (not shown) for managing charging to a battery, or it may be part of the battery management system.

Further, the electric vehicle wireless power transfer system 214 may include switching circuitry (not shown) for selectively connecting and disconnecting the electric vehicle power transfer element 216 to and from the electric vehicle power converter 238. Disconnecting the electric vehicle power transfer element 216 may suspend charging and may change the "load" as "seen" by the base wireless power transfer system 202 (acting as a power transmitter), which may be used to "cloak" the electric vehicle wireless power transfer system 214 (acting as the receiver) from the base wireless power transfer system 202. The load changes may be detected if the base wireless power transfer system 202 includes a load sensing circuit (not shown). Accordingly, the electric vehicle wireless power transfer system 214 (acting as a power transmitter) may include a mechanism for determining when the base power transfer element 204 connected to the base wireless power transfer system 202 (acting as a power receiver) is present in the near field of the electric vehicle power transfer element 216.

As described above, in operation, assuming energy transfer towards the vehicle 112 (battery 118), input power is provided from the power supply 208 such that the base power transfer element 204 generates an electromagnetic field for providing the energy transfer. The electromagnetic field in turn may induce power into the electric vehicle power transfer element 216 that is sufficient for storage or consumption by the electric vehicle 112. As described above, in some implementations, the base transmit circuit 206 and the electric vehicle receive circuit 222 are configured according to a mutual resonant relationship. In some implementations, the resonant frequencies of the base transmit circuit 206 and the electric vehicle receive circuit 222 are very close or substantially the same. Transmission losses between the input of the base wireless power transfer system 202 and the output of the electric vehicle power transfer system 214 may be reduced when the electric vehicle power transfer element 216 is located in the near field of the base power transfer element 204.

While not shown, the base wireless power transfer system 202 and the electric vehicle wireless power transfer system 214 may both include an oscillator, a driver circuit such as a power amplifier, a filter, and a matching circuit for efficient power transfer via the power transfer elements. The oscillator may be configured to generate a desired operating frequency, which may be adjusted in response to an adjustment signal. The oscillator signal may be amplified by a power amplifier with an amplification amount responsive to control signals. The filter and matching circuit may be included to filter out harmonics or other unwanted frequencies and match the impedance as "seen" at the base power transfer element 204 to the base power converter 236. In some implementations, the base power converter 236 may include solid state switching circuitry to generate a suitable power output as needed to charge an electric vehicle battery (e.g., the battery 118). Analogously, filter and matching circuits may be used to match the impedance as "seen" at the electric vehicle power transfer element 216 to the electric vehicle power converter 238. In some implementations, the electric vehicle power converter 238 may include a rectifier and switching circuitry to generate a suitable DC power output to charge the battery.

The electric vehicle power transfer element 216 and the base power transfer element 204 as described throughout the disclosed implementations may be referred to or configured as "loop" antennas, and more specifically, multi-turn loop antennas. The elements 204 and 216 may also be referred to herein or be configured as "magnetic" antennas. The term "power transfer element" refers to a component that may wirelessly output energy or wirelessly receive energy for coupling to another "power transfer element." The power transfer element may also be referred to as an "antenna" or a "coupler" of a type that is configured to wirelessly output or receive power. As used herein, the power transfer elements 204 and 216 are examples of "power transfer elements" of a type that are configured to wirelessly output, wirelessly receive, and/or wirelessly relay power. Loop (e.g., multi-turn loop) antennas may be configured to include an air core or a physical core such as a ferrite core. An air-core loop antenna may allow the placement of other components within the core area. Physical core antennas including ferromagnetic or ferrimagnetic materials may allow development of a stronger electromagnetic field and improved coupling.

Each of the base power transfer element 204 and the electric vehicle power transfer element 216 may be a "circular"-type coil (using a "circular" coil), a "Double D"-type coil (using a double coil arrangement), a "Solenoid"-type coil (using a solenoid coil wound around a core), a "Bipolar"-type coil (using a double coil arrangement with virtually zero coupling between the coils) or any other type of coil structure based on a single or multi-coil arrangement. In some implementations of the wireless power transfer system 200, different power transfer element types may be used for the base power transfer element 204 and the electric vehicle power transfer element 216.

Figure 3:
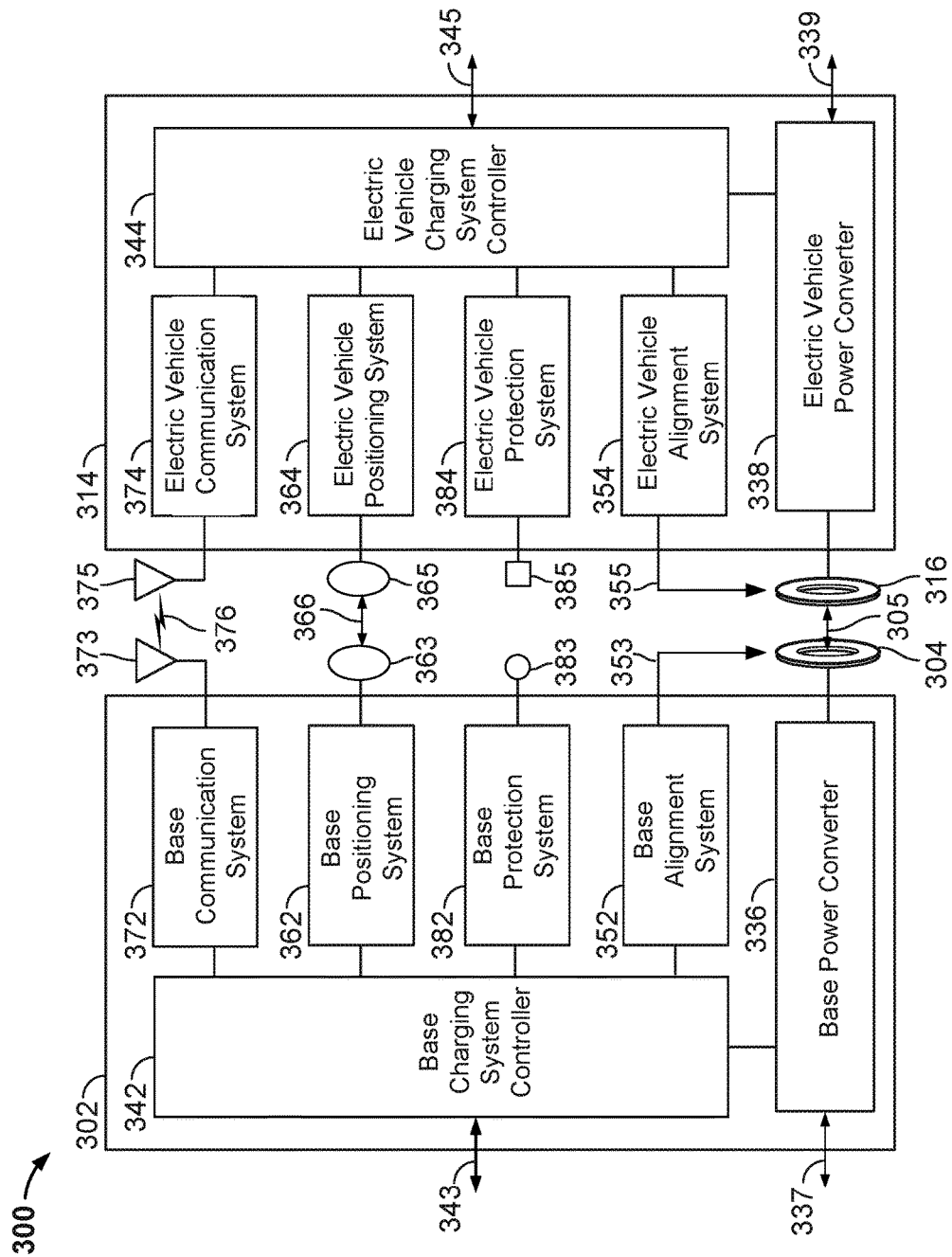
FIG. 3 is a functional block diagram of the primary side and the secondary side of the wireless electric vehicle charging system shown in FIG. 1.

FIG. 3 is another block diagram showing further exemplary components of a wireless charging system 300, e.g., of the wireless charging system 100 of FIG. 1, and/or of which the wireless power transfer system 200 of FIG. 2 may be part. The wireless charging system 300 may be split into a base charging system 302 and an electric vehicle charging system 314. One or more additional components may be included and/or one or more described components may not be included in the base charging system 302 and/or the electric vehicle charging system 314. The base charging system 302 may include a base power converter 336 (e.g., the base power converter 236 of FIG. 2) operationally connected to a base power transfer element 304 (e.g., the base power transfer element 204 of FIG. 2). Further, the base charging system 302 may include a base charging system controller 342 operationally connected to the base power converter 336 and to various ancillary systems such as a base communication system 372 operationally connected to a base communication antenna 373, a base positioning system 362 operationally connected to base positioning antennas 363, a base protection system 382 operationally connected to base protection sensors 383, and a base alignment system 352 operationally connected to a base alignment mechanism 353. One or more of the base alignment system 352, the base protection system 382, the base positioning system 362, and the base communication system 372 may be optional or may use one or more components of one or more of the systems 352, 362, 372, 382 (e.g., the base communication system 372 may provide communication via the base power transfer element 304 through modulation of the magnetic field used for power transfer).

Analogously, the electric vehicle charging system 314 may include an electric vehicle power converter 338 (e.g., the electric vehicle power converter 238 of FIG. 2) operationally connected to an electric vehicle power transfer element 316 (e.g., the electric vehicle element 216 of FIG. 2). Further, the electric vehicle charging system 314 may include an electric vehicle charging system controller 344 operationally connected to the electric vehicle power converter 338 and to various ancillary systems such as an electric vehicle communications system 374 operationally connected to an electric vehicle communication antenna 375, an electric vehicle positioning system 362 operationally connected to electric vehicle positioning antennas 365, an electric vehicle protection system 384 operationally connected to electric vehicle protection sensors 385, and an electric vehicle alignment system 354 operationally connected to an electric vehicle alignment mechanism 355. One or more of the electric vehicle alignment system 354, the electric vehicle protection system 384, the electric vehicle positioning system 364, and the electric vehicle communication system 374 may be optional or may use one or more components of one or more of the systems 354, 364, 374, 384 (e.g., the electric vehicle communication system 374 may receive communications via the electric vehicle power transfer element 304 through detection of modulation of the magnetic field used for power transfer). Any of the systems shown may be provided on one side but not the other (e.g., the electric vehicle protection system 384 may be absent while the base protection system 382 may be present and vice versa).

FIG. 3 also illustrates a wireless power link 305, a communication link 376, and a positioning link 366. Furthermore, FIG. 3 illustrates a base charging system power interface 337 and an electric vehicle charging system power interface 339 as well as a base charging system communication interface 343 and an electric vehicle charging system communication interface 345.

As described above with reference to FIG. 2, and assuming energy flow towards the electric vehicle 112, in FIG. 3 the base charging system power interface 337 may be configured to provide power to the base power converter 336 from a power source, such as an AC or DC power supply, e.g. the local power distribution center 130 as shown in FIG. 1. The base power converter 336 may receive AC or DC power via the base charging system power interface 337 to excite the base power transfer element 304. The electric vehicle power transfer element 316, when in the near-field coupling-mode region, may receive energy in the form of an oscillating signal. The electric vehicle power converter 338 converts the oscillating signal from the electric vehicle power transfer element 316 to a power signal suitable for charging the battery 118 via the electric vehicle charging system power interface 339.

In some implementations, the base wireless charging system 302 and all its subsystems and modules are centrally controlled by the base charging system controller 342 that handles and relays control and status information exchanged between the different subsystems. The base charging system controller 342 may include the base charging system communication interface 343 for communication with other systems (not shown) such as, for example, a computer, and a control center, or a smart power grid communications network. Analogously, the electric vehicle wireless charging system 314 may be centrally controlled by the electric vehicle charging system controller 344 that may include the electric vehicle charging system communication interface 345 for communication with other systems (not shown) such as, for example, a computer on board the vehicle 112, a battery management system that manages charge and discharge of the battery 118, other electronic systems within the vehicle 112, and remote electronic systems. The electric vehicle charging system controller 344 may communicate via the electric vehicle charging system communication interface 345 with a park assistance system by providing position data determined in the electric vehicle positioning system 364 and/or the base positioning system 362. In some implementations, the electric vehicle charging system controller 344 may communicate with a semi-automatic parking system configured to perform an automatic braking when the vehicle 112 has reached the final position for charging. In other implementations, the electric vehicle charging system controller 344 may communicate with an autonomous driving system configured to perform a largely automated parking that may provide higher parking accuracy, thus reducing or eliminating the need for mechanical alignment in any of the base wireless charging system 302 and the electric vehicle wireless charging system 314. Further, the electric vehicle charging system controller 344 may be configured to communicate with other electric vehicle onboard electronics. For example, electric vehicle charging system controller 344 may be configured to communicate with visual output devices (e.g., a dashboard display), acoustic/audio output devices (e.g., a buzzer, speakers) e.g., for purposes of guidance and alignment. The electric vehicle charging system controller 344 may be configured to receive commands from mechanical input devices (e.g., a keyboard, a touch screen, and pointing devices such as a joystick, a trackball, etc.), and from audio input devices (e.g., microphones of an electronic voice recognition system).

The base communication system 372 and the electric vehicle communication system 374 may include subsystems or circuits for specific application with separate communication channels. These communications channels may be separate physical channels or separate logical channels. In some implementations, communications are performed over the communication link 376 at radio frequencies (RF) using an RF communications standard such as Bluetooth®, Zigbee®, Dedicated Short Range Communications (DSRC), WLAN, etc. operating in an unlicensed band. In some other implementations, a cellular radio network is used. As non-limiting examples, the base alignment system 352 may communicate with the electric vehicle alignment system 354 through the communication link 376 to provide a feedback mechanism for more closely aligning the base power transfer element 304 with the electric vehicle power transfer element 316 via mechanical (kinematic) alignment. Similarly, the base positioning system 362 may communicate with the electric vehicle positioning system 364 through the communication link 376 to provide a feedback mechanism to guide an operator to a charging spot and to align the base power transfer element 304 with the electric vehicle power transfer element 316. In addition, there may be separate general-purpose communication links (e.g., channels) supported by the base communication system 372 and the electric vehicle communication system 374 for communicating other information between the base wireless charging system 302 and the electric vehicle wireless charging system 314 e.g., using an Ethernet over radio protocol. This information may include information about electric vehicle characteristics, battery characteristics and charging status, power capabilities and other characteristics of both the base wireless charging system 302 and the electric vehicle wireless charging system 314, as well as maintenance and diagnostic data for the electric vehicle 112. Some implementations may provide sufficient bandwidth for the allocation of value-add services to the vehicle user/owner.

In some implementations, the base positioning system 362 and/or the electric vehicle positioning system 364 are configured to determine the position of the electric vehicle 112 with respect to the charging spot by transmitting suitable signals via the positioning link 366. The positioning link 366 may be bi-directional, meaning that positioning signals may be emitted by the base positioning system 362 or the electric vehicle positioning system 364 or by both.

In some implementations relying on mechanical (kinematic) alignment by physically (mechanically) moving the base power transfer element 304 and/or the electric vehicle power transfer element 316, the base alignment system 352 and/or the electric vehicle alignment system controls the alignment of the base power transfer element 304 and/or the electric vehicle power transfer element 316 via the alignment mechanism 353 and/or the alignment mechanism 355, respectively. In some implementations, information on an alignment offset between the base power transfer element 304 and the electric vehicle power transfer element 316 is provided to the base alignment system 352 and/or to the electric vehicle alignment system 354 by the base positioning system 362 and/or the electric vehicle positioning system 364. In other implementations, information on an alignment offset is determined by the base alignment system 352 and/or by the electric vehicle alignment system 354.

Furthermore, the wireless charging system 300 may include detection and/or sensor systems to protect the wireless charging system 300. For example, the wireless charging system 300 may include the base protection system 382 and the electric vehicle protection system 384. These protection systems 382 and 384 may be configured to detect foreign objects in the space near and/or between the base power transfer element 304 and/or the electric vehicle power transfer element 316. As non-limiting examples, this may include detection of foreign (e.g., metallic) objects that may be heated up (e.g., through induction heating and/or hysteresis losses) (e.g., to critical temperatures) during the wireless charging operation, detection of hazardous events such as may be produced by metallic objects in connection with incandescent materials, and/or temperature monitoring of the base power transfer element 304 and/or the electric vehicle power transfer element 316 and/or of any other part of the wireless charging system 300 and the electric vehicle 112. Further, the protection systems 382 and 384 may be configured to detect living objects approaching the power transfer elements 304 and 316 beyond a radius. In some implementations, the protection systems 382 and 384 may be configured to detect objects based on mechanical alignment of the power transfer elements 304 and/or 316 e.g., mechanical alignment may be sensed as differing from an expected height and/or position based on a foreign object obstructing movement of a power transfer element.

The wireless charging system 300 may support plug-in charging via a wired connection. A wired charge port may integrate the outputs of the two different chargers prior to transferring power to or from the electric vehicle 112. Switching circuits may provide the functionality as needed to support both wireless charging and charging via a wired charge port.

To communicate between a base wireless charging system 302 and an electric vehicle wireless charging system 314, the wireless charging system 300 may use in-band signaling and/or out-of-band signaling. Out-of-band signaling may be performed via the communications link 376 e.g., using a RF technology as previously described. For in-band signaling, a low-depth amplitude or phase modulation of the wireless power carrier signal that may be transmitted on the wireless power link 305 may be used.

To enable wireless high power transfer, some implementations may be configured to transfer power at a frequency, as one example, in the range from 20-150 kHz. This low operating frequency may allow higher efficiency power conversion that may be achieved using solid state devices. In addition, there may be less coexistence issues with radio systems compared to other bands. However, other frequencies of operation in other ranges may also be used (e.g., frequencies in the 6.78 MHz or 13.56 MHz ISM bands).

The various operations of methods described above may be performed by any suitable means capable of performing the operations, such as various hardware and/or software component(s), circuits, and/or module(s). Generally, any operations illustrated in the figures may be performed by corresponding functional means capable of performing the operations.

The wireless charging system 300 may be configured to determine values of components and/or characteristics of the wireless charging system 300. For example, the system 300 may be configured to determine parasitic values of components and/or or values of components that are affected by interaction with other components, such as inductances that are affected by proximity to other components of the system 300. The values of the determined components may be used to adjust power transfer characteristics, e.g., frequency of a magnetic field used to transfer power wirelessly.

Figure 4:
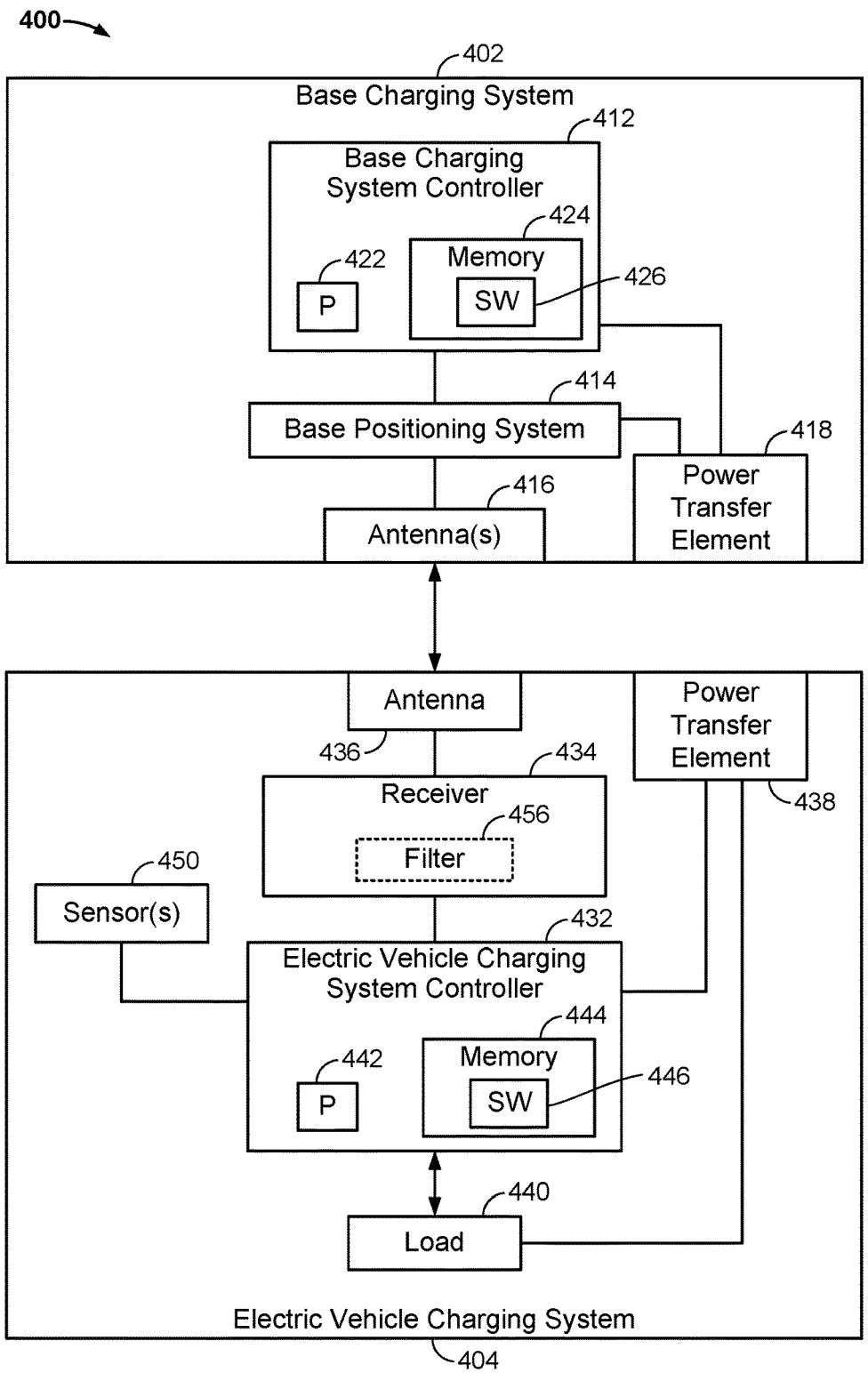
FIG. 4 is a block diagram of a base charging system and an electric vehicle charging system.
Figure 5:
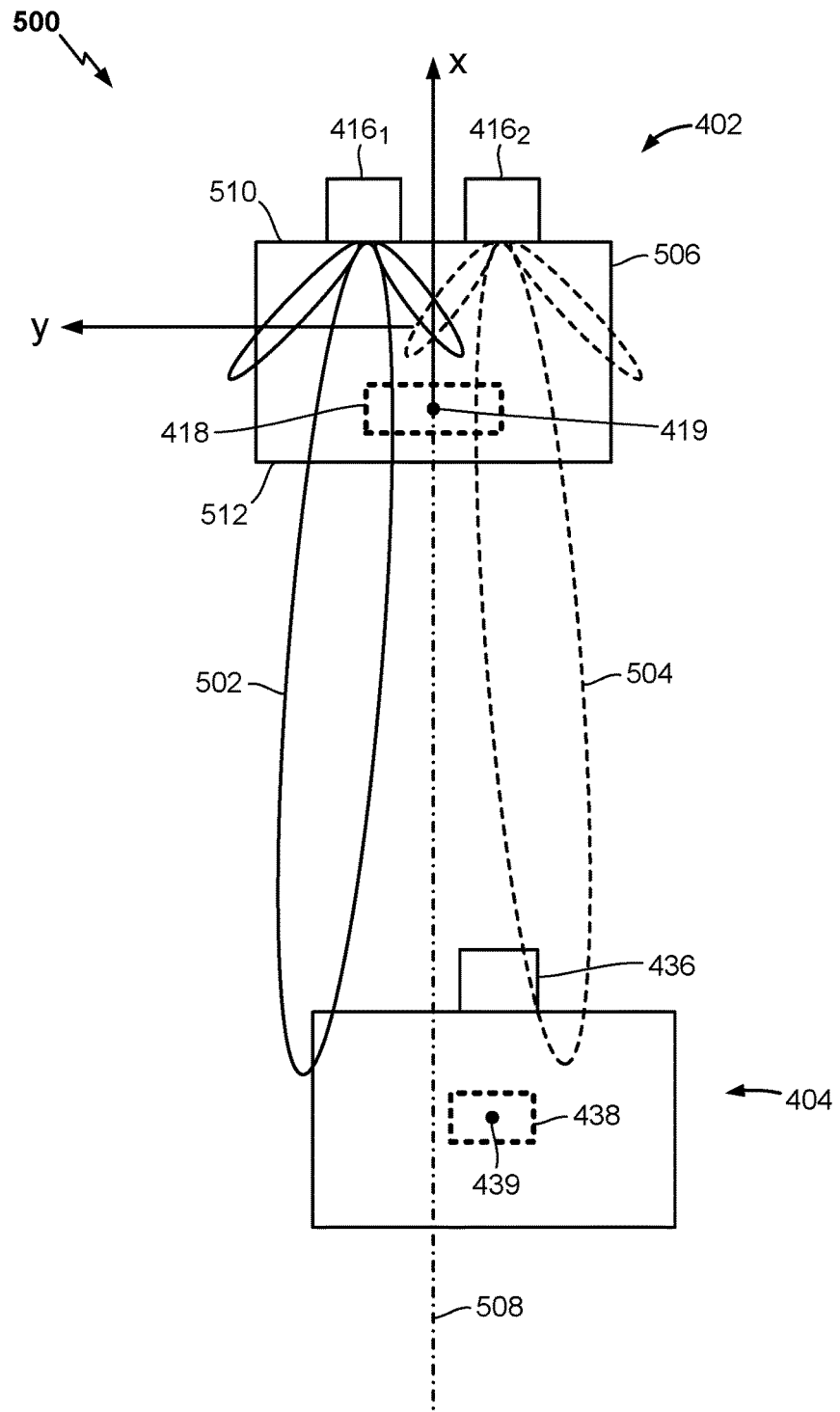
FIG. 5 is a top view of a base pad with antennas transmitting alignment signals, and an electric vehicle charging system including a power transfer element and an antenna for receiving the alignment signals.
Figure 6:
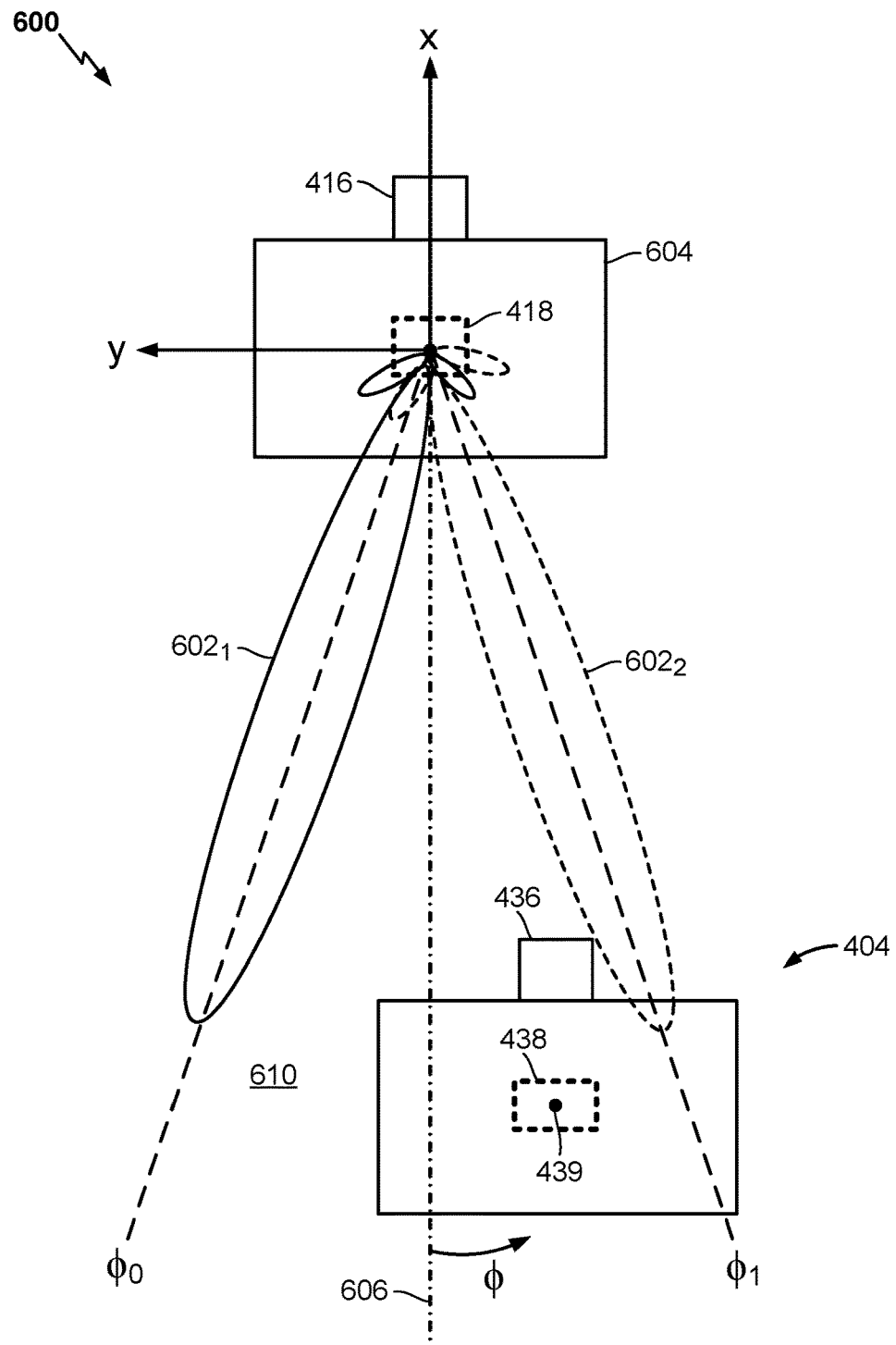
FIG. 6 is a top view of a base pad with an antenna transmitting a sweeping alignment signal, and an electric vehicle charging system including a power transfer element and an antenna for receiving the alignment signal.

Referring to FIGS. 4-5, with further reference to FIGS. 1-3, a wireless charging system 400 is an example of the system 300 and includes a base charging system 402 and an electric vehicle charging system 404, and a system 500 is an example of the system 400. FIG. 4 shows only a portion of the components of the system 300 shown in FIG. 3, while also showing some components not shown in FIG. 3. The system 400 is configured to determine indications of lateral offset and longitudinal offset of a power transfer element of the electric vehicle charging system 404 relative to a power transfer element of the base charging system 402. The system 400 may have different configurations to determine the one or more of the offsets in different ways. For example, as illustrated in FIG. 5, the system 400 may be configured to produce and analyze multiple antenna beams with different frequencies and known, fixed positions and patterns relative to the power transfer element of the base charging system to determine the lateral offset. As another example, as illustrated in FIG. 6, the system 400 may produce a single antenna beam with a changing direction and analyze times of arrival of the antenna beam to determine the lateral offset. Still other configurations are possible. The elements shown in FIG. 4 are functional blocks and do not necessarily represent a physical layout of either the base charging system 402 were the electric vehicle charging system 404.

The base charging system 402 includes a base charging system controller 412, a base positioning system 414, one or more antennas 416, and a power transfer element 418, and the electric vehicle charging system includes an electric vehicle charging system controller 432, a receiver 434, an antenna 436, a power transfer element 438, a load 440, and one or more sensors 450. The controllers 412, 432 may include appropriate hardware and, optionally, software to perform functions discussed herein. The controllers 412, 432 preferably include processors 422, 442 each of which is an intelligent hardware device, for example a central processing unit (CPU) such as those made or designed by QUALCOMM®, ARM®, Intel® Corporation, or AMD®, a microcontroller, an application specific integrated circuit (ASIC), etc. Either or both of the processors 422, 442 may comprise multiple separate physical entities that can be distributed in the systems 402, 404, respectively. Each of the controllers 412, 432 may include a memory 424, 444 that may include random access memory (RAM) and/or read-only memory (ROM). Each the memories 424, 444 is a non-transitory, processor-readable storage medium that stores software 426, 446 which is processor-readable, processor-executable software code containing instructions that are configured to, when performed, cause the respective processor 422, 442 to perform various functions described herein. The description may refer only to the controller 412 and/or the controller 432 performing functions, and this includes the processor 422 and/or the processor 442 performing the functions. The description may refer to only the processor 422 and/or the processor 442 performing functions, but this includes other implementations such as where one or more of the processors 422, 442 executes software and/or firmware. The software 426, 446 may not be directly executable by the processor 422, 442 and instead may be configured to, for example when compiled and executed, cause the processor 422, 442 to perform the functions. Whether needing compiling or not, the software 426, 446 contains the instructions to cause the processor 422, 442 to perform the functions. Further, while the antenna 436 is discussed herein in the singular for simplicity, the antenna 436 may include more than one antenna.

The controller 412 is configured to cause the power transfer element 418 to transmit power that is coupled to the power transfer element 438. The power transfer element 438 is configured to couple to and receive energy transmitted by the power transfer element 418, and to provide the received energy to the load 440. The power transfer element 418 and/or the power transfer element 438 may be an inductive power coupler that can wirelessly and inductively couple to a magnetic field. The power transfer element 438 is configured to receive sufficient energy from the power transfer element 438 to charge and/or operate the load 440. The power transfer element 438 is communicatively coupled to the load 440, which is an electric load (e.g., may be run by electricity, and/or may store energy and emit electricity, etc.), to provide energy to the load 440. While the power transfer element 438 is shown directly coupled to the load 440, the connection (communicative coupling) of the power transfer element 438 to the load 440 may be indirect, e.g., passing through appropriate circuitry to convert the received power for receipt by the load 440. The controller 432, and in particular the processor 442, is communicatively coupled to the load 440, e.g., to monitor energy provided to and/or by the load 440.

The base charging system 402 is configured to emit alignment signals from the antennas 416 with antenna patterns that include main beams 502, 504 as shown in FIG. 5. The controller 412 is configured to send a command to the base positioning system 414 to produce alignment signals having different characteristics, and the base positioning system 414 is configured to respond to the command by producing the alignment signals. For example, the alignment signals may each be continuous wave signals having different frequencies and/or different modulations (e.g., different encoded identifiers). The modulation of one or both of the beams 502, 504 may convey information such as a location of the base charging system 402, e.g., an identifier of a parking stall such as a parking stall number. Any of various forms of modulation (e.g., frequency modulation, phase modulation, and/or amplitude modulation) may be used. Adjacent base charging systems 402 (e.g., for adjacent parking stalls) may use different frequencies of the alignment signals (e.g., $f_1$ and $f_2$ for one parking stall and $f_3$ and $f_4$ for an adjacent parking stall, $f_1$, $f_2$, $f_3$, and $f_4$ being different frequencies). The base positioning system 414 is configured to provide the alignment signals to the antennas $416_1$, $416_2$ that are configured to produce the main beams 502, 504 conveying the alignment signals. The base charging system 402 is configured to cause the antennas 416 to emit the alignment signals with equal amplitudes, or with known relative amplitudes (e.g., a known ratio of amplitudes).

The beams 502, 504 are static beams in that the beams 502, 504 are fixed relative to a base pad 506 that contains the power transfer element 304 and other portions of the base charging system 402. The antennas $416_1$, $416_2$ are fixed relative to the base pad 506 and have a known position relative to a centerline 508 of the power transfer element 304 that corresponds to a center 419 of the power transfer element 418. While the centerline 508 shown in FIG. 5 is a centerline of both the power transfer element 418 and the base pad 506, the power transfer element 418 may not be disposed on a centerline of the base pad 506. The antennas $416_1$, $416_2$ may be centered, as a pair, about the centerline 508, for example, each being disposed about 15-25 cm from the centerline 508 on a respective side of the centerline 508. The centerline 508 is aligned along an x-axis, that is a longitudinal axis for the system 500, and is perpendicular to a y-axis, that is a lateral axis for the system 500. The antennas 416 may be integrated into the base pad 506. As shown, the antennas 416 are disposed at a far end 510 (distal end) of the base pad 506 relative to the electric vehicle charging system 404. The antennas 416 may be disposed elsewhere, e.g., at a front end 512 (proximal end) of the base pad 506. For example, the antennas 416 may be integrated at the front end 512 and may be linear patch arrays with antenna elements spaced apart from each other by one-half wavelength each. For such an array, the 3 dB beamwidth may be approximated by 102°/N where N is the number of elements. Thus, for an antenna with 12 patch antenna elements, a beamwidth of 8.5° may be produced. In the K-band, around 24 GHz, rectangular patches may have dimensions as small as 3 mm by 2 mm, leading to an overall array length of about 70 mm. Thus, K-band antennas may be desirable due to the size of an acceptable K-band array, and because a K-band array may be covered with plastic without introducing unacceptably high losses. A narrower beamwidth may be achieved by using a tapered linear array with non-equal element spacing.

The antennas 416 are configured to produce the beams 502, 504 with different microwave frequencies. For example, the beams 502, 504 may have frequencies in the K-band (18 GHz-26.5 GHz), e.g., near 24 GHz, or in the W-band (75 GHz-110 GHz), e.g., near 79 GHz. Preferably, both of the beams 502, 504 have frequencies in the same band, but have frequencies sufficiently different that they may be distinguished by the electric vehicle charging system 404. For example, a difference of several megahertz, e.g., 0.5-5 MHz, or more may be used for the beams 502, 504. The transmit magnitudes for the beams 502, 504 sent by the antennas 416 are preferably equal, although they may be different. The antennas 416 may be configured to produce the beams 502, 504 to be narrow, e.g., with 3 dB beamwidths between 4° and 12°. The antennas 416 are disposed, in this example, to direct the beams 502, 504 slightly away from the centerline 508, e.g., between 2° and 10° away from the centerline 508.

The electric vehicle charging system 404 is configured to receive, distinguish, and analyze the alignment signals from the beams 502, 504 to determine an indication of lateral offset of the power transfer element 316 relative to the power transfer element 304. The antenna 436 is configured to receive the alignment signals, being configured to receive signals of the frequencies of the beams 502, 504. The antenna 436 has a beam to receive significant amounts of energy from the beams 502, 504 while being misaligned from the antennas 416. For example, a 20 dBi horn may be used as the antenna 436.

The receiver 434 is configured to receive the alignment signals from the antenna 436, process the alignment signals, and provide the alignment signals to the controller 432. The receiver 434 is configured to process the alignment signals to digitize the alignment signals for processing by the controller 432, and provide the digitized versions of the alignment signals to the controller 432. In this example, the receiver 434 includes a filter 456 that is configured to differentiate or distinguish the alignment signals based on the frequencies of the alignment signals. For example, the filter 456 may include multiple band-pass filters that are each configured to pass only one of the alignment signals. The filter 456 may be an analog filter or a digital filter. If the filter 456 is a digital filter, then the filter 456 may be implemented by the controller 432.

The controller 432 may be configured to reduce the effects of multipath and/or side-lobe reception that might disturb the received alignment signals. For example, the controller 432 may use historical data regarding the received alignment signals, e.g., averaging the received magnitudes of the alignment signals, or discarding anomalous data (e.g., data that changes rapidly), in order to improve the centerline offset determination.

The controller 432, and in particular the processor 442, is communicatively coupled to the receiver 434 and configured to analyze the alignment signals provided by the receiver 434 to determine one or more alignment values. For example, the controller 432 may be configured to analyze the alignment signals to determine amplitudes of the alignment signals, and/or to determine a relative amplitude of one alignment signal relative to another alignment signal. The controller 432, e.g., the processor 442 in accordance with the software 446 stored on the memory 444, is configured to determine an offset of the power transfer element 438 relative to the power transfer element 418 based on the one or more alignment values. Thus, for example, the controller 432 may be configured to determine whether a center 439 of the power transfer element 438 is disposed left (in the positive y-direction as shown in FIG. 5) of the centerline 508, right (in the negative wire-direction as shown in FIG. 5) of the centerline 508, or aligned with the centerline 508. For example, assuming the transmit amplitude of the alignment signals are equal from the antennas 416, then the controller may determine the relative lateral position of the power transfer element 438 relative to the power transfer element 418 as follows:

$$A_{RX}(f_1) > A_{RX}(f_2) \rightarrow \text{center 439 is left of centerline 508} \quad (1)$$

$$A_{RX}(f_1) < A_{RX}(f_2) \rightarrow \text{center 439 is right of centerline 508} \quad (2)$$

$$A_{RX}(f_1) = A_{RX}(f_2) \rightarrow \text{center 439 is on the centerline 508} \quad (3)$$

where the alignment signal in the beam 502 has a frequency $f_1$, the alignment signal in the beam 502 has a frequency $f_2$, $A_{RX}(f_1)$ is the magnitude of the alignment signal in the beam 502 received by the antenna 436, and $A_{RX}(f_2)$ is the magnitude of the alignment signal in the beam 504 received by the antenna 436. A difference of the magnitudes of the alignment signals, $A_{RX}(f_1) - A_{RX}(f_2)$, may be called an offset difference D. As the magnitudes of the alignment signals may rarely be exactly equal, a margin or threshold may be provided for the condition of the power transfer element 438 being sufficiently aligned with the power transfer element 418 (i.e., the center 439 of the power transfer element 438 being "on" the centerline 508). For example, if a magnitude of the offset difference D is less than or equal to a threshold, i.e., $|A_{RX}(f_1)-A_{RX}(f_2)| \leq X$, where X is a threshold value such as 1 dB, then the center 439 of the power transfer element 438 could be considered to be on the centerline 508. In this case, the controller 432 may determine the relative alignment of the power transfer element 418 and the power transfer element 438 as follows:

$$A_{RX}(f_1)-A_{RX}(f_2) > X \rightarrow \text{center 439 is left of centerline 508} \quad (4)$$

$$A_{RX}(f_1)-A_{RX}(f_2) < -X \rightarrow \text{center 439 is right of centerline 508} \quad (5)$$

$$|A_{RX}(f_1)-A_{RX}(f_2)| \leq X \rightarrow \text{center 439 is "on" the centerline 508} \quad (6)$$

Thus, the controller 432 may determine that the lateral offset of the power transfer element 438 relative to the power transfer element 418 is toward a source (e.g., one of the antennas 416) of whichever of the alignment signals has a higher magnitude.

The controller 432 may also be configured to determine or measure a tendency or drift of the power transfer element 438 relative to the power transfer element 418. For example, the controller 432 may be configured to determine that if the magnitude of the offset difference D decreases over time, then the center 439 of the power transfer element 438 is approaching the centerline 508. The controller 432 may be configured to determine that if the magnitude of the offset difference D increases over time, then the center 439 of the power transfer element 438 is moving or drifting away from the centerline 508. In these scenarios, it is assumed that a center of the antenna 436 is aligned with the center 439 of the power transfer element 438. This, however, is not required and the center of the antenna 436 may be misaligned relative to the center 439 of the power transfer element 438, in which case an offset is taken into account for determining alignment of the center 439 of the power transfer element 438 with the centerline 508. For example, each of the conditions (1)-(3) or (4)-(6) may include an offset, e.g., a magnitude difference of the alignment signal magnitudes corresponding to when the center 419 of the power transfer element 418 is aligned with the center 439 of the power transfer element 438.

The controller 432 may be configured to validate the centerline offset determination. For example, the controller 432 may be configured to communicate with the one or more sensors 450 to determine whether information from the one or more sensors 450 is consistent with changes in the centerline offset calculations. The sensor(s) 450 may include a steering sensor configured to monitor steering data. The controller 432 may be configured to analyze the magnitude of the offset difference D in conjunction with the steering data, e.g., such that if the magnitude of the offset difference D is greater than X, i.e., $|A_{RX}(f_1)-A_{RX}(f_2)| > X$, the electric vehicle 112 is steered to the right, and the magnitude of the offset difference D does not decrease, then the controller 432 can determine that an error exists, e.g., in the measurement of the alignment signals, in the calculation of the magnitude of the offset difference D, and/or in the sensor data, and/or elsewhere. The controller 432 may be configured to produce an alert in response to determining that an error exists.

While FIG. 5 and the discussion above addresses a situation with the two transmit antennas 416 and the two transmit beams 502, 504, other configurations with more than two transmit beams may be used. For example, three beams could be used, the beams 502, 504 shown in FIG. 5 offset from the centerline 508 and a third beam directed along the centerline 508 and conveying a third alignment signal having a frequency $f_3$ that is different from the frequencies $f_1$, $f_2$. In this case, the filter 456 could differentiate or distinguish the three signals from each other. The controller 432 in this case may be configured to determine differences of the alignment signals, e.g., $A_{RX}(f_1)-A_{RX}(f_2)$, $A_{RX}(f_3)-A_{RX}(f_2)$, and $A_{RX}(f_1)-A_{RX}(f_3)$, as alignment values and determine a lateral offset of the power transfer element 438 relative to the power transfer element 418 using these alignment values. For example, the differences $A_{RX}(f_3)-A_{RX}(f_2)$ and $A_{RX}(f_1)-A_{RX}(f_3)$ may be used to confirm the offset determined by the difference $A_{RX}(f_1)-A_{RX}(f_2)$.

The controller 432 may be configured to estimate a distance from the antenna 436 to the antennas 416, and hence a distance from the power transfer element 438 to the power transfer element 418. The controller 432 may be configured to use a transmit power of the antennas 416, either communicated to the electric vehicle charging system 404 or stored in the memory 444, and gains of the antennas 416, 436, and the received power amount(s) (e.g., received signal strength indication(s)) of the alignment signal(s), the controller 432 can calculate a distance from the antenna 436 to the antennas 416. The controller 432 can use this distance, a stored distance from the antennas 416 to the power transfer element 418, and a stored distance from the antenna 436 to the power transfer element 438 to determine a distance (which may be an estimated distance) from the power transfer element 418 to the power transfer element 438. This distance is a longitudinal offset of the power transfer elements 418, 438. The controller 432 may be configured to use this distance to determine when to activate a coupling check. For example, the controller 432 may activate the coupling check only if the controller 432 determines (only in response to determining) that the longitudinal offset is below a threshold distance. This threshold distance may correspond to a front 113 (FIG. 1) of the vehicle 112 being over the base pad 506, e.g., to help avoid magnetic field exposure higher than allowed limits to objects such as living objects. In the coupling check, the controller 432 communicates with the controller 412 to have the power transfer element provide a small amount of power, and the controller 432 monitors the amount of power received by the power transfer element 438. The controller 432 is configured to respond to the power transfer element 438 receiving more than a threshold amount (e.g., a threshold percentage) of the power from the power transfer element 418 by communicating to the controller 412 that full charging power may be provided by the power transfer element 418.

The controller 432 may be configured to extract encoded information from one or more of the alignment signals. For example, the controller 432 may be configured to analyze one or more of the alignment signals to interpret modulation of the signal(s) to determine information encoded in the signal(s) by the modulation. Thus, the controller 432 may be configured to determine a parking stall associated with the alignment signal(s) if this information is encoded into the alignment signal(s).

Referring to FIG. 6, with further reference to FIGS. 1-5, a system 600 is another example implementation of the wireless charging system 400 and is configured to produce a beam 602 at a base pad 604, with the beam 602 being swept laterally (i.e., in the x-y plane). For example, the beam 602 may be swept (scanned) over an angular range from a maximum left-offset (MLO) angle $\phi_0$ to a maximum right-offset (MRO) angle $\phi_1$ corresponding to the beam $602_1$ and the beam $602_2$. The magnitude of the MLO angle $\phi_0$ may be equal to the magnitude of the MRO angle $\phi_1$, such that the beam 602 is swept equal amounts left and right of a centerline 606 corresponding to the power transfer element 418. The beam 602 thus sweeps over a sector 610 centered on the centerline 606.

The antenna 416 is configured to sweep the beam 602 electronically. The antenna 416 may be a patch antenna as discussed above and may alone or in combination with the controller 412 and/or the base positioning system 414 electronically steer the beam 602 by adjusting phases to elements (e.g., patches) of the antenna 416. That is, different radiating elements of the antenna 416 are provided with different phases of excitation signals and the phases change over time to steer the beam 602, i.e., to change the angle of the beam 602 relative to the centerline 606. The beam 602 is swept at a known, constant speed (e.g., degrees per second) while being swept and with a known repetition rate (e.g., sweeps per second, with one sweep being travel of the beam 602 across the sector 610 twice). The beam 602 may be deactivated or at least not moved relative to the antenna 416 for a known pause time between sweeps. For example, the beam 602 may take a sweep time $t_s$ to traverse the sector 610 twice, and may be paused for a pause time $t_p$ between consecutive sweeps, such that a repetition rate of the sweeps is given by $1/(t_s+t_p)$ with $t_s$ and $t_p$ in seconds. By pausing the beam 602 after each sweep, preferably for longer than the sweep time $t_s$, the controller 432 may be able to determine which instances of receipt of the beam 602 correspond to the same sweep more easily than if no pause or a pause less than the sweep time $t_s$ is used. For example, the controller 432 can determine that two times of receipt of the beam 602 that are separated by less than the pause time correspond to a single sweep. Further, by spreading out the times of receipt of the beam 602, the signal processing circuitry of the electric vehicle charging system 404 may be less complex and less expensive than if the times of receipt were not spread out.

The antenna 436 receives the beam 602 twice during each sweep. The antenna 436 may be configured to have a broad mainbeam, and the controller 432 may be configured to determine peaks in the received energy from the beam 602 and corresponding times of those peaks and to assign the times of those peaks as times of receipt of the beam 602. Alternatively, the antenna 436 may be configured to have a relatively narrow mainbeam beamwidth, e.g., similar to the beamwidth of the beam 602 such as a 3 dB beamwidth of about 12° or less. In this case, the controller 432 may be configured to determine peaks in the energy received, and/or may be configured to determine a duration over which received energy exceeds a threshold and to determine a midpoint of this duration and assign that as a time of receipt of the beam 602. Still other configurations are possible for determining times of receipt of the beam 602 by the antenna 436.

Figure 7:
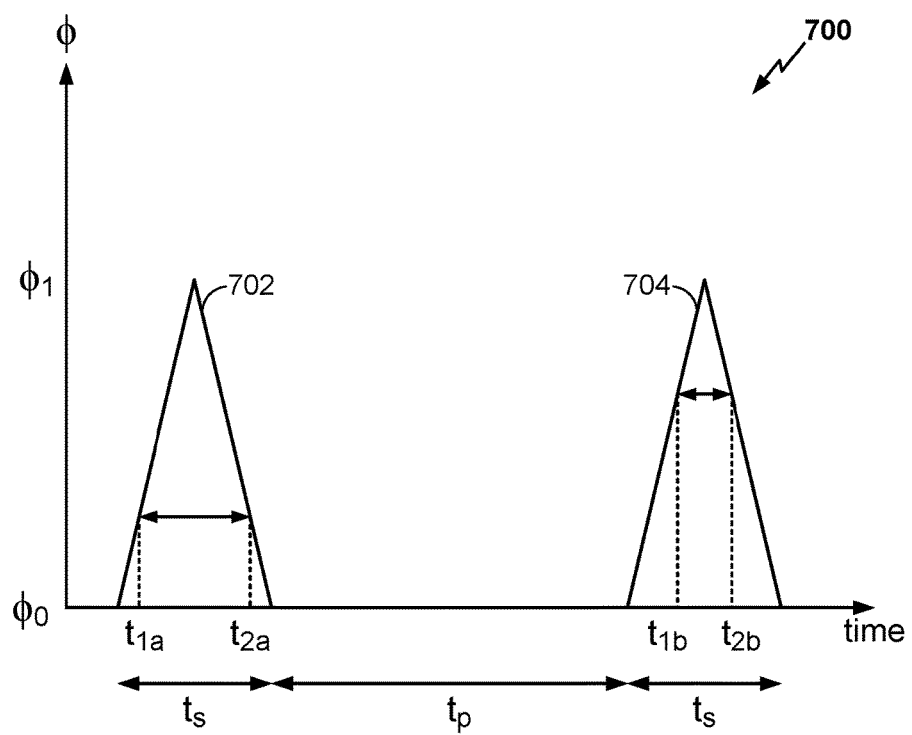
FIG. 7 is a timing diagram of receipt of the sweeping alignment signal by the antenna of the electric vehicle charging system shown in FIG. 6.

The controller 432 is configured to determine a lateral offset of the power transfer element 438 based on times of receipt of the beam 602. Referring also to FIG. 7, a plot 700 shows an angle $\phi$ of the beam 602 relative to the centerline 606 over time. The beam 602 sweeps from $\phi_0$ to $\phi_1$ and back to $\phi_0$ in the sweep time $t_s$ during a first sweep 702, then pauses for the pause time $t_p$, then sweeps again from $\phi_0$ to $\phi_1$ and back to $\phi_0$ in the sweep time $t_s$ during a second sweep 704. In this example, the beam 602 is received by the antenna 436 at times $t_{1a}$ and $t_{1b}$ during the first sweep 702 and at times $t_{2a}$ and $t_{2b}$ during the second sweep 704. This example is for illustration only as the lateral alignment of the power transfer elements 418, 438 will not likely change as much as this example indicates between consecutive sweeps of the beam 602. The controller 432 may be configured to determine a time difference between the times of receipt of the beam 602, i.e., a difference between a time of arrival of the beam 602 at one time and a time of arrival of the beam 602 at another time, as an arrival time difference $(t_2-t_1)$. The arrival time difference during a single sweep, here between the times $t_{1a}$ and $t_{2a}$ and between the times $t_{1b}$ and $t_{2b}$, is directly proportional to the angular lateral offset of the antenna 436 relative to the antenna 416. The controller 432 may be configured to calculate the arrival time difference as an alignment value and determine the angular lateral offset based on the alignment value. The controller 432 may be configured to convert the angular lateral offset of the antenna 436 relative to the antenna 416 to the angular lateral offset of the power transfer element 438 relative to the power transfer element 418 using the location of the power transfer element 418 relative to the antenna 416 and the location of the power transfer element 438 relative to the antenna 416. Here, it is assumed that the angular offset of the antennas 416, 436 is the same as the angular offset of the power transfer elements 418, 438, i.e., that the location of the power transfer element 418 relative to the antenna 416 is the same as the location of the power transfer element 438 relative to the antenna 416. Thus, if the arrival time difference is equal to half the sweep time $t_s$ $(t_2-t_1=t_s/2)$, then the power transfer element 438 is aligned with the power transfer element 418, i.e., the center 439 is on the centerline 606. If the arrival time difference is less than half the sweep time $t_s$ $(t_2-t_1<t_s/2)$ as shown in the sweep 704, then the center 439 of the power transfer element 438 is on the right side of the centerline 606 (because the sweep of the beam 602 begins on the left side of the centerline 606 at angle $\phi_0$). If the arrival time difference is greater than half the sweep time $t_s$ $(t_2-t_1<t_s/2)$ as shown in the sweep 702, then the center 439 of the power transfer element 438 is on the left side of the centerline 606. Further, if the controller 432 has access to the sweep time and sector size, e.g., values of these parameters are stored in the memory 444, then the controller 432 can determine a difference angle $\Delta\phi$ relative to the angle $\phi_1$ using the sweep time (sweep period) and the angular sweep range (sector size). For example, the controller 432 may determine $\Delta\phi$ as follows:

$$\Delta\phi = \frac{(\phi_1 - \phi_0)}{t_s} \cdot (t_1 - t_2) \quad (7)$$

Using Equation (7), the difference angle $\Delta\phi$ will be negative. The angle $\phi$ relative to the centerline 606 can be determined by the difference angle $\Delta\phi$ and the angle $\phi_1$.

$$\phi=\Delta\phi+\phi_1 \quad (8)$$

Figure 8:
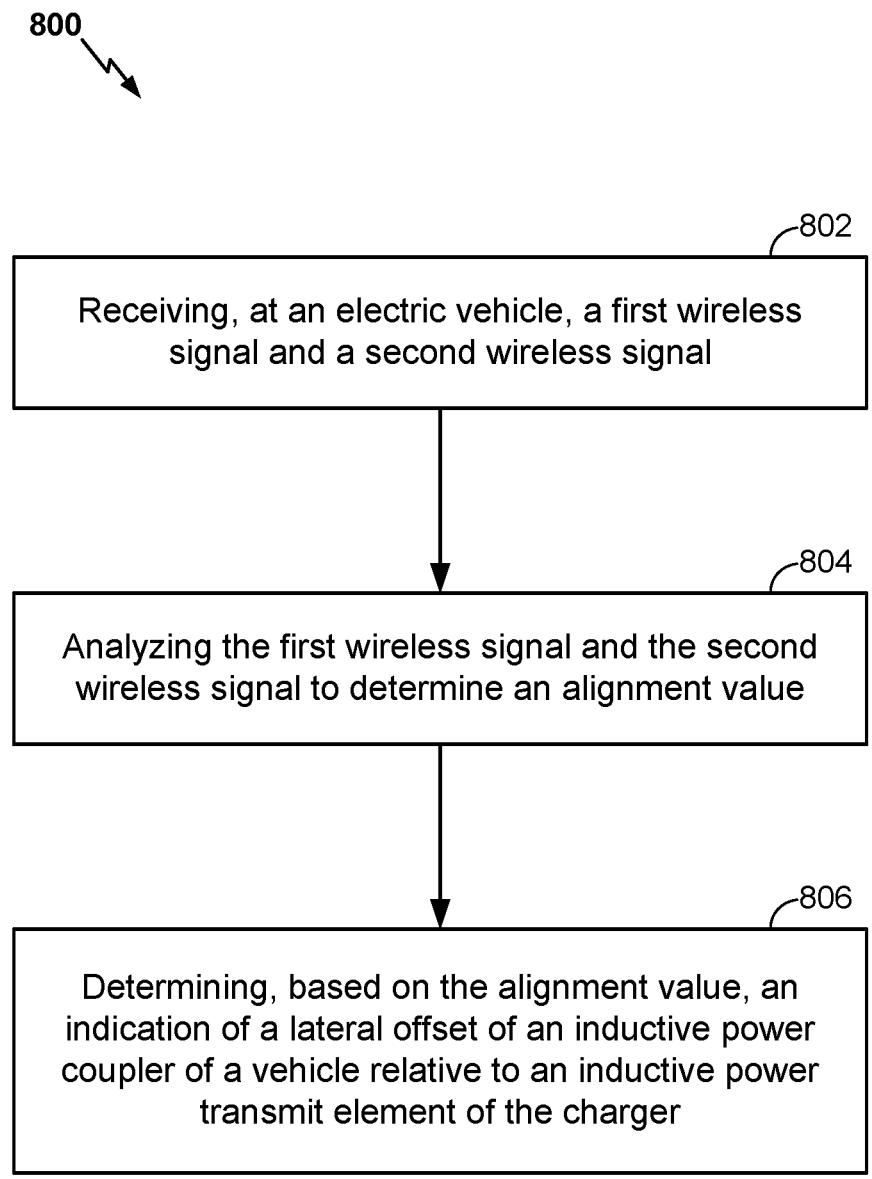
FIG. 8 is a block flow diagram of a method of determining alignment of an inductive power coupler of an electric vehicle relative to a power transmit element.

Referring to FIG. 8, with further reference to FIGS. 1-7, a method 800 of determining alignment of an inductive power coupler of an electric vehicle relative to a power transmit element includes the stages shown. The method 800 is, however, an example only and not limiting. The method 800 may be altered, e.g., by having stages added, removed, rearranged, combined, performed concurrently, and/or having single stages split into multiple stages.

At stage 802, the method 800 includes receiving, at the electric vehicle, a first wireless signal and a second wireless signal. For example, the antenna 436 of the electric vehicle charging system 404 receives the alignment signals in the beams 502, 504. As another example, the antenna 436 receives the beams $602_1$, $602_2$ as the wireless signals, i.e., receives the beam 602 at different times as the wireless signals. Means for receiving the wireless signals may include the antenna 436, the receiver 434, and the controller 432.

At stage 804, the method 800 includes analyzing the first wireless signal and the second wireless signal to determine an alignment value. For example, the alignment value may be a magnitude of the first wireless signal relative to a magnitude of the second wireless signal. The controller 432 may determine the magnitude of the alignment signal in the beam 502 relative to the magnitude of the alignment signal in the beam 504. Analyzing the wireless signals may include distinguishing the wireless signals based on respective frequencies of the wireless signals. For example, the filter 456 may separate the wireless signals and/or provide separate indications of the wireless signals for analysis by the controller 432. As another example, the alignment value may be a difference between a time of arrival of the first wireless signal and a time of arrival of the second wireless signals. Means for analyzing the wireless signals to determine the alignment value may include the controller 432, and the filter 456 in the case of wireless signals of different frequencies.

At stage 806, the method 800 includes determining, based on the alignment value, an indication of a lateral offset of the inductive power coupler of the vehicle relative to the inductive power transmit element. For example, the controller 432 may determine that the lateral offset of the inductive power coupler relative to the inductive power transmit element is toward a source of whichever of the wireless signals has a higher magnitude. In this example, the controller 432 determines that the inductive power coupler is laterally offset relative to the inductive power transmit element toward a source of whichever of the wireless signals has a higher received magnitude. As another example, with the alignment value being a difference in arrival times of the wireless signals, determining the lateral offset may be based on a sweep period associated with the wireless signals and an angular sweep range associated with the wireless signals. In this example, the indication of the lateral offset may be an angle relative to a centerline of the inductive power transmit element. Means for determining the lateral offset may include the controller 432 and in particular the processor 442 and the memory 444, including the software 446.

The method 800 may include one or more further stages. For example, with the alignment value being a first alignment value that is a relative magnitude of the wireless signals, the method 800 may further include: receiving a third wireless signal, distinguishing the third wireless signal from the first and second wireless signals (e.g., based on respective frequencies of the signals), determining second and third alignment values as magnitude differences between the first and third wireless signals and the second and third wireless signals, respectively. In this example, determining the indication of the lateral offset may be based on the first, second, and third alignment values. Means for performing these functions may include the controller 432, the antenna 436, and the receiver 434 (including the filter 456). As another example, the method 800 may include initiating a coupling check in response to an estimated longitudinal offset of the inductive power coupler and the inductive power transmit element being below a threshold distance, and determining an indication of a longitudinal offset of the inductive power coupler and the inductive power transmit element based on the coupling check. Means for performing these functions may include the controllers 432, 412, the power transfer elements 418, 438, the communication systems 372, 374, and the antennas 373, 375. The method may further include determining the estimated longitudinal offset based on a received signal strength of at least one of the wireless signals. Means for determining the estimated longitudinal offset may include the controller 432. As another example, the method 800 may include determining a parking stall associated with the wireless signals. Means for determining the parking stall may include the controller 432.

Other Considerations

Other examples and implementations are within the scope and spirit of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, "or" as used in a list of items prefaced by "at least one of" or prefaced by "one or more of" indicates a disjunctive list such that, for example, a list of "at least one of A, B, or C," or a list of "one or more of A, B, or C" means A or B or C or AB or AC or BC or ABC (i.e., A and B and C), or combinations with more than one feature (e.g., AA, AAB, ABBC, etc.).

The term "exemplary" indicates that something is an example and does not imply that the thing (e.g., a feature or embodiment) is better than or preferred over another thing. Thus, an "exemplary embodiment" may not be the best known embodiment, and may not be preferred over another embodiment, but the exemplary embodiment is an example of an embodiment that may be used.

Further, an indication that information is sent or transmitted, or a statement of sending or transmitting information, "to" an entity does not require completion of the communication. Such indications or statements include situations where the information is conveyed from a sending entity but does not reach an intended recipient of the information. The intended recipient, even if not actually receiving the information, may still be referred to as a receiving entity, e.g., a receiving execution environment. Further, an entity that is configured to send or transmit information "to" an intended recipient is not required to be configured to complete the delivery of the information to the intended recipient. For example, the entity may provide the information, with an indication of the intended recipient, to another entity that is capable of forwarding the information along with an indication of the intended recipient.

Components, functional or otherwise, shown in the figures and/or discussed herein as being connected or communicating with each other are communicatively coupled. That is, they may be directly or indirectly connected to enable signal transmission between them.

Substantial variations may be made in accordance with specific requirements. For example, customized hardware might also be used. Further, connection to other computing devices such as network input/output devices may be employed.

The methods, systems, and devices discussed above are examples. Various configurations may omit, substitute, or add various procedures or components as appropriate. For instance, in alternative configurations, the methods may be performed in an order different from that described, and that various steps may be added, omitted, or combined. Also, features described with respect to certain configurations may be combined in various other configurations. Different aspects and elements of the configurations may be combined in a similar manner. Also, technology evolves and, thus, many of the elements are examples and do not limit the scope of the disclosure or claims.

Specific details are given in the description to provide a thorough understanding of example configurations (including implementations). However, configurations may be practiced without these specific details. For example, well-known circuits, structures, and techniques have been shown without unnecessary detail in order to avoid obscuring the configurations. This description provides example configurations only, and does not limit the scope, applicability, or configurations of the claims. Rather, the preceding description of the configurations provides a description for implementing described techniques. Various changes may be made in the function and arrangement of elements without departing from the spirit or scope of the disclosure.

Also, configurations may be described as a process which is depicted as a flow diagram or block diagram. Although each may describe the operations as a sequential process, many of the operations can be performed in parallel or concurrently. In addition, the order of the operations may be rearranged. A process may have additional stages or functions not included in the figure.

Components, functional or otherwise, shown in the figures and/or discussed herein as being coupled, connected, or communicating with each other are operably coupled. That is, they may be directly or indirectly, wired or wirelessly, connected to enable signal flow between them.

A statement that a value exceeds (or is more than or above) a first threshold value is equivalent to a statement that the value meets or exceeds a second threshold value that is slightly greater than the first threshold value, e.g., the second threshold value being one value higher than the first threshold value in the resolution of a computing system. A statement that a value is less than (or is within or below) a first threshold value is equivalent to a statement that the value is less than or equal to a second threshold value that is slightly lower than the first threshold value, e.g., the second threshold value being one value lower than the first threshold value in the resolution of a computing system.

Having described several example configurations, various modifications, alternative constructions, and equivalents may be used without departing from the spirit of the disclosure. For example, the above elements may be components of a larger system, wherein other rules may take precedence over or otherwise modify the application of the invention. Also, a number of operations may be undertaken before, during, or after the above elements are considered. Accordingly, the above description does not bound the scope of the claims.

Further, more than one invention may be disclosed.

The invention claimed is:

1. A wireless electric vehicle charging system comprising:
   an electric load;
   an inductive power coupler communicatively coupled to the electric load and configured to couple wirelessly and inductively to a magnetic field to receive sufficient energy from an inductive power transmit element to at least one of charge the electric load or to operate the electric load;
   a receiver; and
   a processor communicatively coupled to the receiver and to the electric load and configured to:
      determine an alignment value associated with a first signal received by the receiver and a second signal received by the receiver, wherein the alignment value is a magnitude of the first signal relative to a magnitude of the second signal or is a difference between a time of arrival of the first signal and a time of arrival of the second signal; and
      determine, based on the alignment value, an indication of a lateral offset of the inductive power coupler relative to the inductive power transmit element.

2. The system of claim 1, wherein the alignment value is the magnitude of the first signal relative to the magnitude of the second signal, the system further comprising a filter communicatively coupled to the receiver and configured to differentiate the first signal from the second signal based on respective frequencies of the first signal and the second signal.

3. The system of claim 2, wherein:
   the filter is further configured to differentiate the first signal and the second signal from a third signal, received by the receiver, based on a frequency of the third signal;
   the alignment value is a first alignment value;
   the processor is configured to determine a second alignment value as a magnitude difference between the first signal and the third signal, and to determine a third alignment value as a magnitude difference between the second signal and the third signal; and
   the processor is configured to determine the indication of the lateral offset of the inductive power coupler and the inductive power transmit element based on the first alignment value, the second alignment value, and the third alignment value.

4. The system of claim 1, wherein the alignment value is the magnitude of the first signal relative to the magnitude of the second signal and the processor is configured to determine that the lateral offset of the inductive power coupler relative to the inductive power transmit element is toward a source of whichever of the first signal or the second signal has a higher magnitude.

5. The system of claim 1, wherein the alignment value is the difference between the time of arrival of the first signal and the time of arrival of the second signal, and wherein the processor is configured to determine the indication of the lateral offset of the inductive power coupler relative to the inductive power transmit element using a sweep period associated with the first signal and the second signal and an angular sweep range associated with the first signal and the second signal, the indication of the lateral offset being an angle relative to a centerline of the inductive power transmit element.

6. The system of claim 1, wherein the processor is further configured to determine an indication of a longitudinal offset of the inductive power coupler and the inductive power transmit element by performing a coupling check between the inductive power coupler and the inductive power transmit element, and wherein the processor is configured to initiate the coupling check in response to an estimated longitudinal offset between the inductive power coupler and the inductive power transmit element being below a threshold distance.

7. The system of claim 6, wherein the processor is configured to determine the estimated longitudinal offset between the inductive power coupler and the inductive power transmit element based on a received signal strength of at least one of the first signal or the second signal.

8. The system of claim 1, wherein the processor is configured to determine a parking stall associated with the first signal and the second signal.

9. A method of determining alignment of an inductive power coupler of an electric vehicle relative to an inductive power transmit element, the method comprising:
   receiving, at the electric vehicle, a first wireless signal and a second wireless signal;
   analyzing the first wireless signal and the second wireless signal to determine an alignment value, the alignment value being a magnitude of the first wireless signal relative to a magnitude of the second wireless signal or being a difference between a time of arrival of the first wireless signal and a time of arrival of the second wireless signal; and
   determining, based on the alignment value, an indication of a lateral offset of the inductive power coupler of the electric vehicle relative to the inductive power transmit element.

10. The method of claim 9, wherein the alignment value is the magnitude of the first wireless signal relative to the magnitude of the second wireless signal, and the analyzing comprises distinguishing the first wireless signal from the second wireless signal based on respective frequencies of the first wireless signal and the second wireless signal.

11. The method of claim 10, wherein the alignment value is a first alignment value, the method further comprising:
   receiving, at the electric vehicle, a third wireless signal;
   distinguishing the third wireless signal from the first wireless signal and the second wireless signal based on respective frequencies of the first wireless signal, the second wireless signal, and the third wireless signal;
   determining a second alignment value as a magnitude difference between the first wireless signal and the third wireless signal; and
   determining a third alignment value as a magnitude difference between the second wireless signal and the third wireless signal;
   wherein determining the indication of the lateral offset comprises determining the indication of the lateral offset based on the first alignment value, the second alignment value, and the third alignment value.

12. The method of claim 9, wherein determining the indication of the lateral offset includes determining that the lateral offset of the inductive power coupler relative to the inductive power transmit element is toward a source of whichever of the first wireless signal or the second wireless signal has a higher magnitude.

13. The method of claim 9, wherein the alignment value is the difference between the time of arrival of the first wireless signal and the time of arrival of the second wireless signal, and wherein determining the indication of the lateral offset of the inductive power coupler relative to the inductive power transmit element is based on a sweep period associated with the first wireless signal and the second wireless signal and an angular sweep range associated with the first wireless signal and the second wireless signal, the indication of the lateral offset being an angle relative to a centerline of the inductive power transmit element.

14. The method of claim 9, further comprising:
   initiating a coupling check between the inductive power coupler and the inductive power transmit element in response to an estimated longitudinal offset between the inductive power coupler and the inductive power transmit element being below a threshold distance; and
   determining an indication of a longitudinal offset of the inductive power coupler and the inductive power transmit element based on the coupling check.

15. The method of claim 14, further comprising determining the estimated longitudinal offset between the inductive power coupler and the inductive power transmit element based on a received signal strength of at least one of the first wireless signal or the second wireless signal.

16. The method of claim 9, further comprising determining a parking stall associated with the first wireless signal and the second wireless signal.

17. A wireless electric vehicle charging system comprising:
   an electric load;
   coupling means, communicatively coupled to the electric load, for receiving energy wirelessly from a power transmit element to at least one of charge the electric load or to operate the electric load;
   receiving means for receiving a first alignment signal and a second alignment signal; and
   first determining means for determining an alignment value associated with a first signal received by the receiving means and a second signal received by the receiving means, wherein the alignment value is a magnitude of the first signal relative to a magnitude of the second signal or is a difference between a time of arrival of the first signal and a time of arrival of the second signal; and
   second determining means for determining, based on the alignment value, an indication of a lateral offset of the coupling means relative to the power transmit element.

18. The system of claim 17, wherein the alignment value is the magnitude of the first alignment signal relative to the magnitude of the second alignment signal, the system further comprising differentiating means, communicatively coupled to the receiving means, for differentiating the first alignment signal from the second alignment signal based on respective frequencies of the first alignment signal and the second alignment signal.

19. The system of claim 18, wherein:
   the differentiating means are further for differentiating the first alignment signal and the second alignment signal from a third alignment signal, received by the receiving means, based on a frequency of the third alignment signal;
   the alignment value is a first alignment value;
   the first determining means are for determining a second alignment value as a magnitude difference between the first alignment signal and the third alignment signal, and for determining a third alignment value as a magnitude difference between the second alignment signal and the third alignment signal; and
   the second determining means are for determining the indication of the lateral offset of the coupling means and the power transmit element based on the first alignment value, the second alignment value, and the third alignment value.

20. The system of claim 17, wherein the alignment value is the magnitude of the first alignment signal relative to the magnitude of the second alignment signal and the second determining means are for determining that the lateral offset of the coupling means relative to the power transmit element is toward a source of whichever of the first alignment signal or the second alignment signal has a higher magnitude.

21. The system of claim 17, wherein the alignment value is the difference between the time of arrival of the first alignment signal and the time of arrival of the second alignment signal, and wherein the second determining means are for determining the indication of the lateral offset of the coupling means relative to the power transmit element using a sweep period associated with the first alignment signal and the second alignment signal and an angular sweep range associated with the first alignment signal and the second alignment signal, the indication of the lateral offset being an angle relative to a centerline of the power transmit element.

22. The system of claim 17, further comprising longitudinal offset means for determining an indication of a longitudinal offset of the coupling means and the power transmit element by performing a coupling check between the coupling means and the power transmit element, wherein the longitudinal offset means are further for initiating the coupling check in response to an estimated longitudinal offset between the coupling means and the power transmit element being below a threshold distance.

23. The system of claim 22, wherein the longitudinal offset means are further for determining the estimated longitudinal offset between the coupling means and the power transmit element based on a received signal strength of at least one of the first alignment signal or the second alignment signal.

24. A non-transitory, processor-readable storage medium comprising instructions configured to cause a processor to:
analyze a first wireless signal and a second wireless signal to determine an alignment value, the alignment value being a magnitude of the first wireless signal relative to a magnitude of the second wireless signal or being a difference between a time of arrival of the first wireless signal and a time of arrival of the second wireless signal; and
determine, based on the alignment value, an indication of a lateral offset of an inductive power coupler of a vehicle relative to an inductive power transmit element of a wireless charger.

25. The storage medium of claim 24, wherein the alignment value is the magnitude of the first wireless signal relative to the magnitude of the second wireless signal, the storage medium further comprising instructions configured to cause the processor to distinguish the first wireless signal from the second wireless signal based on respective frequencies of the first wireless signal and the second wireless signal.

26. The storage medium of claim 25, wherein the alignment value is a first alignment value, the storage medium further comprising instructions configured to cause the processor to:
distinguish a third wireless signal from the first wireless signal and the second wireless signal based on respective frequencies of the first wireless signal, the second wireless signal, and the third wireless signal;
determine a second alignment value as a magnitude difference between the first wireless signal and the third wireless signal; and
determine a third alignment value as a magnitude difference between the second wireless signal and the third wireless signal;
wherein the instructions configured to cause the processor to determine the indication of the lateral offset comprise instructions configured to cause the processor to determine the indication of the lateral offset based on the first alignment value, the second alignment value, and the third alignment value.

27. The storage medium of claim 24, wherein the instructions configured to cause the processor to determine the indication of the lateral offset comprise instructions configured to cause the processor to determine that the lateral offset of the inductive power coupler relative to the inductive power transmit element is toward a source of whichever of the first wireless signal or the second wireless signal has a higher magnitude.

28. The storage medium of claim 24, wherein the alignment value is the difference between the time of arrival of the first wireless signal and the time of arrival of the second wireless signal, and wherein the instructions configured to cause the processor to determine the indication of the lateral offset comprise instructions configured to cause the processor to determine the indication of the lateral offset of the inductive power coupler relative to the inductive power transmit element based on a sweep period associated with the first wireless signal and the second wireless signal and an angular sweep range associated with the first wireless signal and the second wireless signal, the indication of the lateral offset being an angle relative to a centerline of the inductive power transmit element.

29. The storage medium of claim 24, further comprising instructions configured to cause the processor to:
initiate a coupling check between the inductive power coupler and the inductive power transmit element in response to an estimated longitudinal offset between the inductive power coupler and the inductive power transmit element being below a threshold distance; and
determine an indication of a longitudinal offset of the inductive power coupler and the inductive power transmit element based on the coupling check.

30. The storage medium of claim 29, further comprising instructions configured to cause the processor to determine the estimated longitudinal offset between the inductive power coupler and the inductive power transmit element based on a received signal strength of at least one of the first wireless signal or the second wireless signal.

* * * * *